United States Patent
Wang et al.

(10) Patent No.: US 11,844,220 B2
(45) Date of Patent: Dec. 12, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Yiping Wang, Boise, ID (US); Andrew Li, Boise, ID (US); Haoyu Li, Boise, ID (US); Matthew J. King, Boise, ID (US); Wei Yeeng Ng, Boise, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/074,055

(22) Filed: Dec. 2, 2022

(65) Prior Publication Data
US 2023/0104297 A1    Apr. 6, 2023

Related U.S. Application Data

(62) Division of application No. 15/931,421, filed on May 13, 2020, now Pat. No. 11,621,273.

(51) Int. Cl.
*H01L 21/00* (2006.01)
*H10B 43/27* (2023.01)
(Continued)

(52) U.S. Cl.
CPC ........... *H10B 43/27* (2023.02); *H01L 21/283* (2013.01); *H01L 21/30608* (2013.01);
(Continued)

(58) Field of Classification Search
CPC .... H10B 43/27; H10B 41/27; H01L 21/30604
See application file for complete search history.

(56) References Cited

U.S. PATENT DOCUMENTS

| 6,162,737 A | 12/2000 | Weimer et al. |
| 10,256,252 B1 | 4/2019 | Kanazawa |

(Continued)

FOREIGN PATENT DOCUMENTS

| TW | 201707193 | 2/2017 |
| TW | 202119605 | 5/2021 |
| WO | WO PCT/US2022/037724 | 11/2022 |

OTHER PUBLICATIONS

Hopkins et al., U.S. Appl. No. 17/475,057, filed Sep. 14, 2021, titled "Memory Arrays Comprising Strings Of Memory Cells And Methods Used In Forming A Memory Array Comprising Strings Of Memory Cells", 52 pages.
(Continued)

*Primary Examiner* — Reema Patel
(74) *Attorney, Agent, or Firm* — Wells St. John P.S.

(57) ABSTRACT

Some embodiments include an integrated assembly having a first structure containing semiconductor material, and having a second structure contacting the first structure. The first structure has a composition along an interface with the second structure. The composition includes additive to a concentration within a range of from about $10^{18}$ atoms/cm$^3$ to about $10^{21}$ atoms/cm$^3$. The additive includes one or more of carbon, oxygen, nitrogen and sulfur. Some embodiments include methods of forming integrated assemblies.

14 Claims, 33 Drawing Sheets

(51) Int. Cl.
- *H01L 21/283* (2006.01)
- *H01L 21/306* (2006.01)
- *H10B 41/27* (2023.01)
- *H10B 41/35* (2023.01)
- *H10B 43/35* (2023.01)

(52) U.S. Cl.
CPC ............ *H10B 41/27* (2023.02); *H10B 41/35* (2023.02); *H10B 43/35* (2023.02)

(56) References Cited

U.S. PATENT DOCUMENTS

| | | |
|---|---|---|
| 10,522,562 B2 | 12/2019 | Kim et al. |
| 10,770,476 B1 | 9/2020 | Chung et al. |
| 10,854,627 B1 | 12/2020 | Moriyama |
| 11,056,505 B2 | 7/2021 | Hopkins et al. |
| 2009/0140312 A1 | 6/2009 | Nishihara |
| 2014/0261685 A1 | 9/2014 | Liao |
| 2015/0000743 A1 | 1/2015 | Miyamichi |
| 2015/0104916 A1 | 4/2015 | Lee |
| 2015/0255482 A1 | 9/2015 | Takahashi |
| 2015/0279857 A1 | 10/2015 | Kim et al. |
| 2016/0043093 A1 | 2/2016 | Lee et al. |
| 2017/0110470 A1 | 4/2017 | Rabkin et al. |
| 2017/0148810 A1 | 5/2017 | Kai et al. |
| 2017/0373089 A1 | 12/2017 | Kim et al. |
| 2019/0288000 A1 | 9/2019 | Choi |
| 2019/0333931 A1* | 10/2019 | Jung ................. H01L 29/40114 |
| 2020/0083246 A1 | 3/2020 | Inatsuka |
| 2020/0303391 A1 | 9/2020 | Tang et al. |
| 2020/0411536 A1 | 12/2020 | Kim |
| 2021/0005455 A1 | 1/2021 | Wang et al. |
| 2021/0028282 A1 | 1/2021 | Kumar et al. |
| 2021/0175249 A1 | 6/2021 | Hopkins et al. |
| 2021/0193675 A1 | 6/2021 | Howder |
| 2021/0358940 A1 | 11/2021 | Wang |

OTHER PUBLICATIONS

Hopkins et al., U.S. Appl. No. 17/746,404, filed May 17, 2022, titled "Memory Arrays Comprising Strings Of Memory Cells And Methods Used In Forming A Memory Array Comprising Strings Of Memory Cells", 45 pages.

Hopkins et al., U.S. Appl. No. 17/830,108, filed Jun. 1, 2022, titled "Memory Arrays Comprising Strings Of Memory Cells And Methods Used In Forming A Memory Array Comprising Strings Of Memory Cells", 50 pages.

Li et al., U.S. Appl. No. 17/752,207, filed May 24, 2022, titled "Memory Arrays Comprising Strings Of Memory Cells And Methods Used In Forming A Memory Array Comprising Strings Of Memory Cells", 51 pages.

U.S. Appl. No. 16/708,673, filed Dec. 10, 2019 by Hopkins et al.

U.S. Appl. No. 17/674,219, filed Feb. 17, 2022 by Hopkins et al.

* cited by examiner

INTEGRATED ASSEMBLIES AND METHODS OF FORMING INTEGRATED ASSEMBLIES

RELATED PATENT DATA

This patent is a divisional of and claims priority to U.S. patent application Ser. No. 15/931,421, filed May 13, 2020, the disclosures of which are incorporated herein by reference.

TECHNICAL FIELD

Integrated assemblies (e.g., memory arrangements), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 5 is a diagrammatic top-down view and FIG. 5A is a diagrammatic cross-sectional side view along the line A-A of FIG. 5.

FIG. 9 is a diagrammatic top-down view and FIG. 9A is a diagrammatic cross-sectional side view along the line A-A of FIG. 9.

FIG. 10 is a diagrammatic top-down view and FIG. 10A is a diagrammatic cross-sectional side view along the line A-A of FIG. 10.

FIG. 11 is a diagrammatic top-down view and FIG. 11A is a diagrammatic cross-sectional side view along the line A-A of FIG. 11.

FIG. 12 is a diagrammatic top-down view and FIG. 12A is a diagrammatic cross-sectional side view along the line A-A of FIG. 12.

FIG. 13 is a diagrammatic top-down view and FIG. 13A is a diagrammatic cross-sectional side view along the line A-A of FIG. 13.

FIG. 14 is a diagrammatic top-down view and FIG. 14A is a diagrammatic cross-sectional side view along the line A-A of FIG. 14.

FIG. 15 is a diagrammatic top-down view and FIG. 15A is a diagrammatic cross-sectional side view along the line A-A of FIG. 15.

DETAILED DESCRIPTION OF THE ILLUSTRATED EMBODIMENTS

Some embodiments include methods in which additive (specifically, one or more of carbon, sulfur, nitrogen and oxygen) is incorporated into semiconductor material (e.g., silicon). The additive may reduce a rate of removal of such semiconductor material upon exposure to etchant (e.g., etchant comprising hot phosphoric acid). Such may alleviate a risk of over-etching through the semiconductor material. Some embodiments include integrated assemblies having one or more of carbon, sulfur, nitrogen and oxygen incorporated into semiconductor material to a concentration within a range of from about $10^{18}$ atoms/cm$^3$ to about $10^{21}$ atoms/cm$^3$. Example embodiments are described with reference to FIGS. 5-24.

Figure 1:
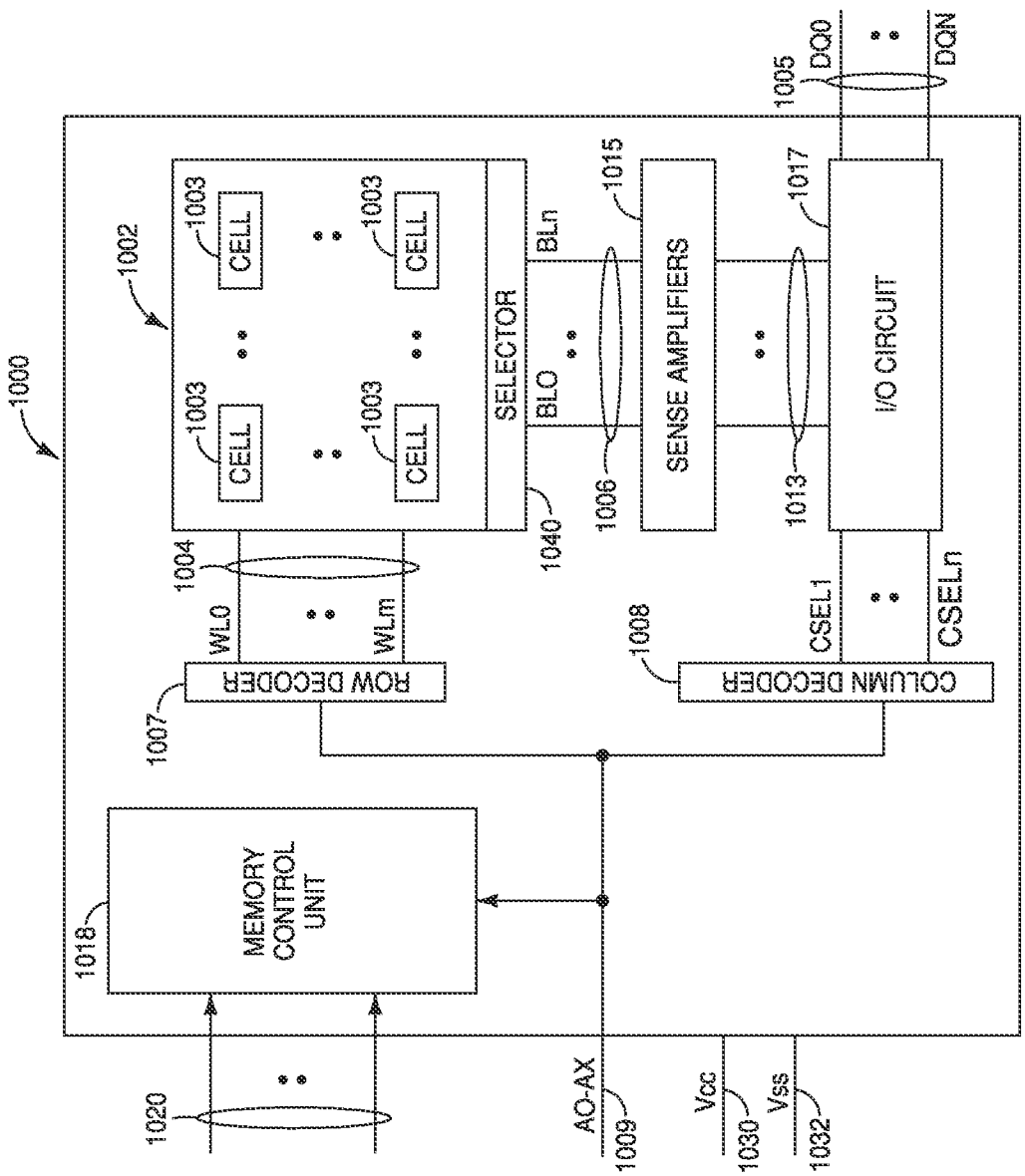
FIG. 1 shows a block diagram of a prior art memory device having a memory array with memory cells.
Figure 2:
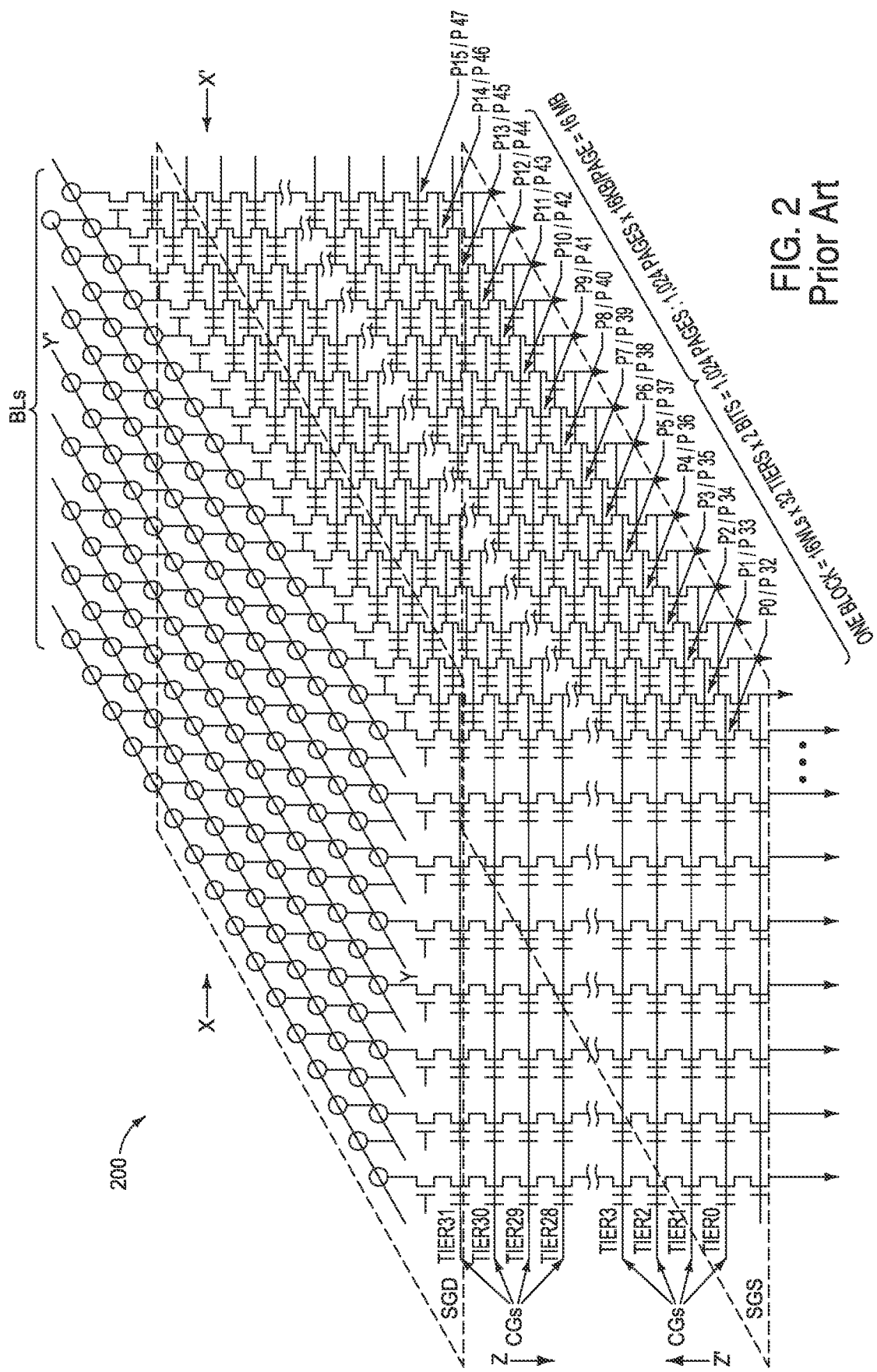
FIG. 2 shows a schematic diagram of the prior art memory array of FIG. 1 in the form of a 3D NAND memory device.
Figure 3:
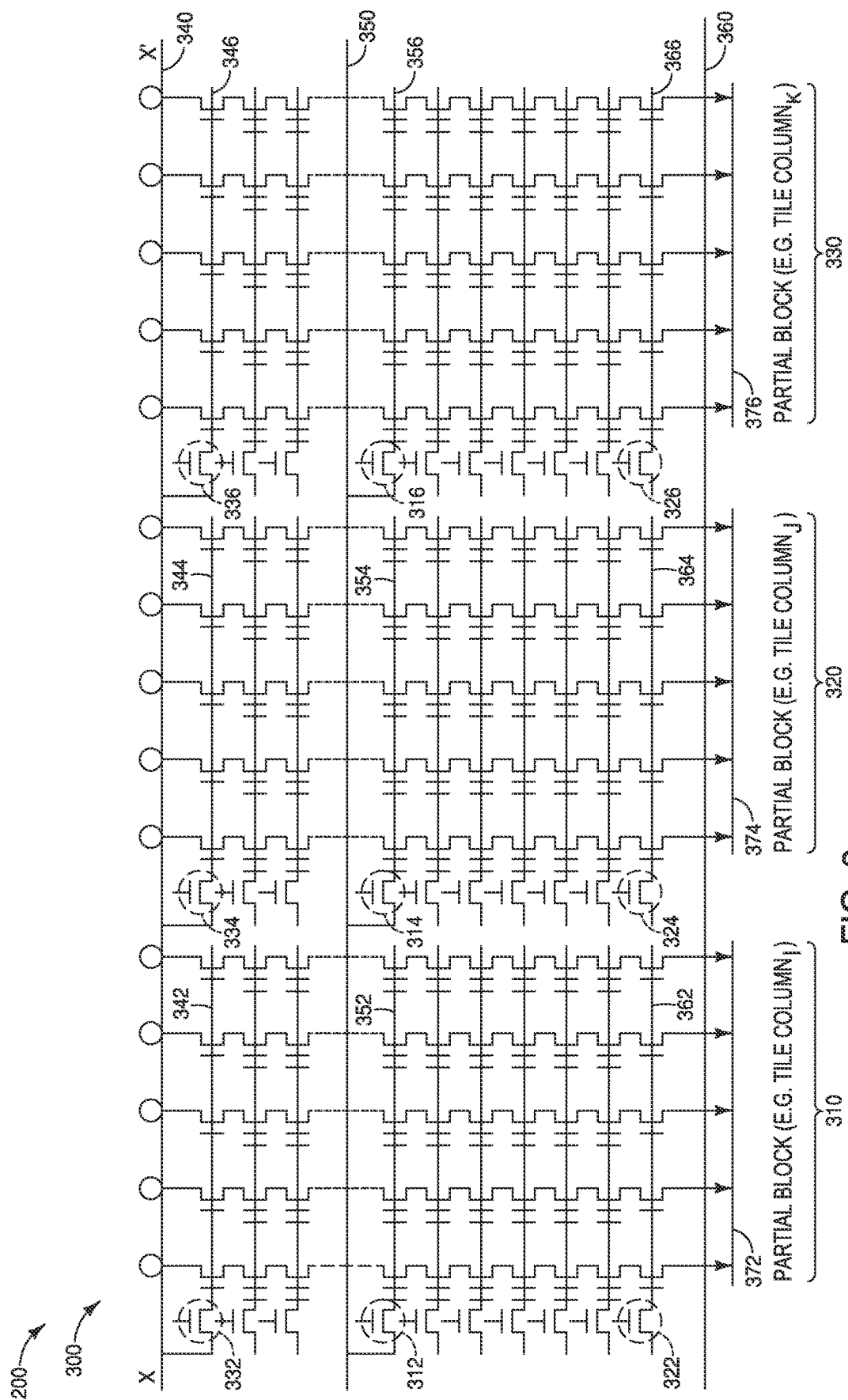
FIG. 3 shows a cross-sectional view of the prior art 3D NAND memory device of FIG. 2 in an X-X' direction.
Figure 4:
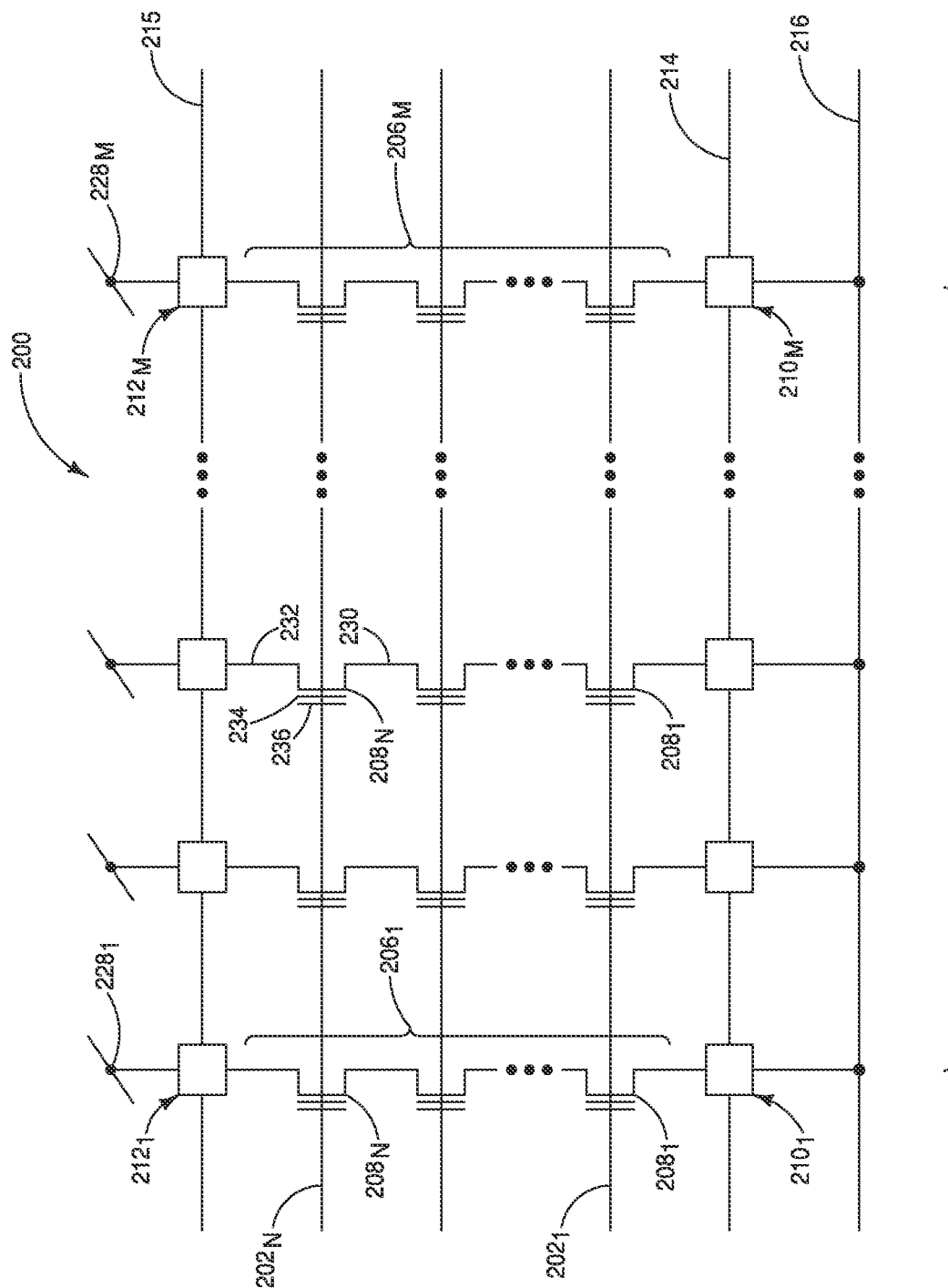
FIG. 4 is a schematic diagram of a prior art NAND memory array.
Figure 5:
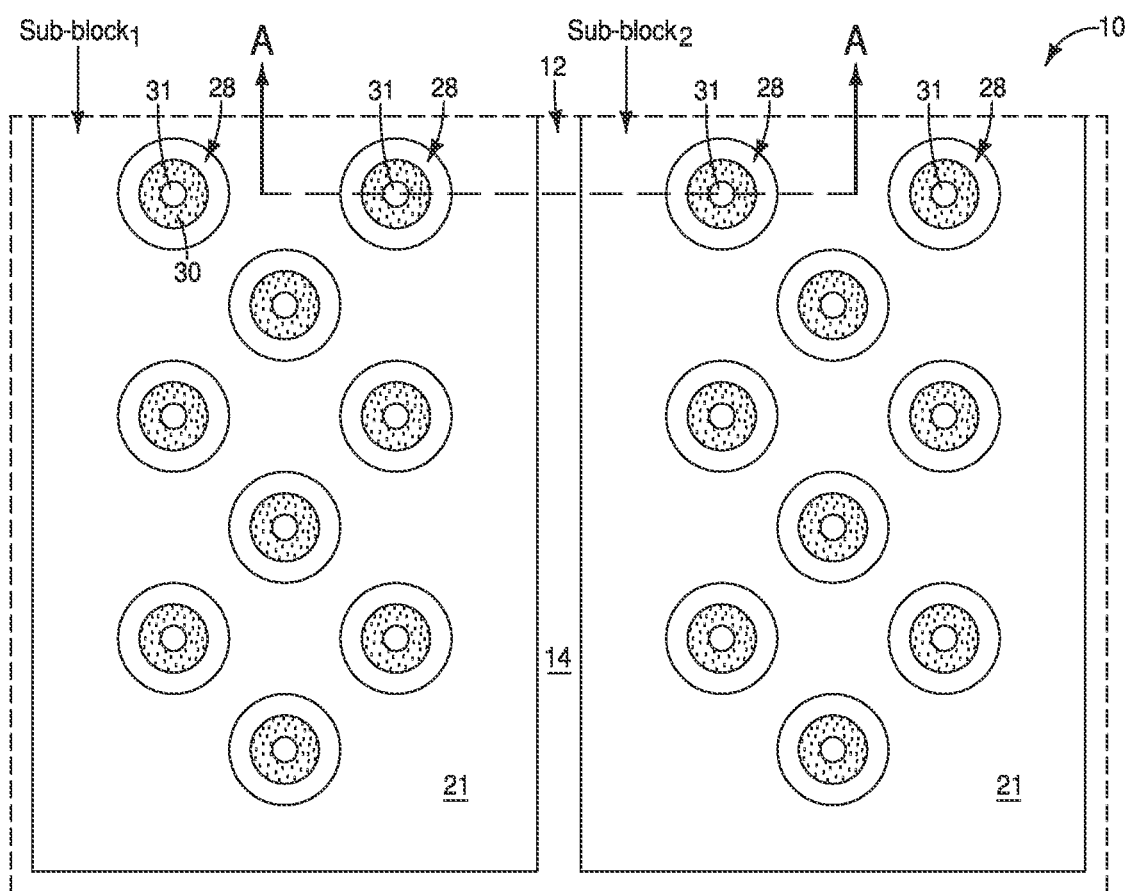
FIGS. 5 and 5A are views of a region of an integrated assembly illustrating an example architecture.
Figure 5A:
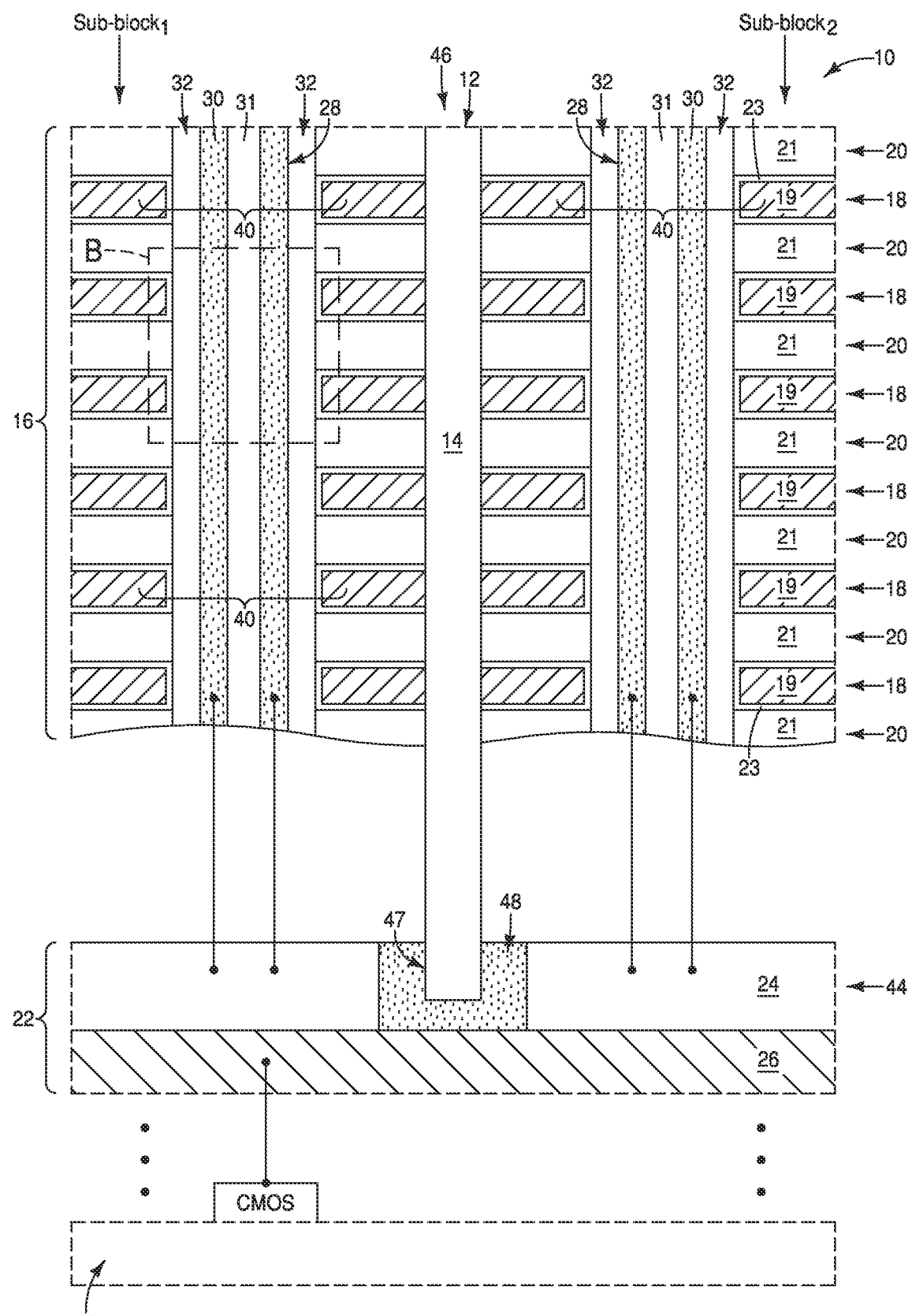

Referring to FIGS. 5 and 5A, regions of an example integrated assembly (memory device) 10 are illustrated. The assembly includes a block region which is subdivided amongst a pair of sub-blocks (labeled "Sub-block$_1$" and "Sub-block$_2$"). The sub-blocks may be arranged in configurations suitable for three-dimensional NAND architectures (NAND memory devices), such as, for example, architectures of the types described above with reference to FIGS. 1-4.

A partition (panel) 12 separates the sub-blocks from one another. The partition 12 comprises a partition material (panel material) 14. The partition material 14 may be an insulative material, and may comprise any suitable composition(s). In some embodiments, the partition material 14 may comprise, consist essentially of, or consist of silicon dioxide.

The cross-sectional view of FIG. 5A shows that the assembly 10 includes a stack 16 of alternating conductive levels 18 and insulative levels 20. The levels 18 comprise conductive material 19, and the levels 20 comprise insulative material 21.

The conductive material 19 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 19 may include metal (e.g., tungsten) and metal nitride (e.g., tantalum nitride, titanium nitride, etc.).

In the illustrated embodiment, a dielectric barrier material 23 is along an outer periphery of the conductive material 19. The dielectric barrier material may comprise any suitable composition(s); and in some embodiments may comprise one or more of aluminum oxide, hafnium oxide, zirconium oxide, etc.

The insulative material 21 may comprise any suitable composition(s); and in some embodiments may comprise, consist essentially of, or consist of silicon dioxide.

The levels 18 and 20 may be of any suitable thicknesses; and may be the same thickness as one another or different thicknesses relative to one another. In some embodiments, the levels 18 and 20 may have vertical thicknesses within a range of from about 10 nanometers (nm) to about 400 nm.

There may be any suitable number of the conductive levels 18 within the stack 16. The conductive levels 18 may be referred to as wordline (routing, access, memory cell) levels. In some applications, the wordline levels may ultimately correspond to memory cell levels of a NAND memory configuration (NAND assembly, NAND memory device). The NAND memory configuration will include strings of memory cells (i.e., NAND strings), with the number of memory cells in the strings being determined by the number of vertically-stacked memory cell levels. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc.

The stack 16 and the partition 12 are supported over a conductive structure 22. Such conductive structure comprises a semiconductor-containing material (or semiconductor material) 24 over a metal-containing material 26. In the illustrated embodiment, the semiconductor-containing material 24 is directly against the metal-containing material 26.

The semiconductor-containing material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor-containing material 24 may comprise, consist essentially of, or consist of conductively-doped silicon.

The metal-containing material 26 may comprise any suitable composition(s), such as, for example, one or more of various metals (e.g., titanium, tungsten, cobalt, nickel, platinum, ruthenium, etc.) and/or metal-containing compositions (e.g., metal silicide, metal nitride, metal carbide, etc.). In some embodiments, the metal-containing material 26 may comprise, consist essentially of, or consist of WSi$_x$, where x is greater than 0. In some embodiments, the metal-containing material 26 may comprise one or more of titanium, tungsten, cobalt, nickel and molybdenum. In some embodiments, the metal-containing material 26 may comprise one or more of metal silicide, metal germanide, metal carbide, metal nitride, metal oxide and metal boride.

In some embodiments, the conductive structure 22 may correspond to a source structure (e.g., a structure comprising the common source line 216 of FIG. 4). The source structures of FIGS. 1-4 are referred to as "lines" in accordance with traditional nomenclature, but such lines may be comprised by an expanse rather than a simple wiring line.

Channel material pillars 28 extend through the stack 16. The channel material pillars comprise channel material 30. The channel material 30 may comprise any suitable composition(s); and in some embodiments may comprise one or more semiconductor materials (e.g., may comprise, consist essentially of, or consist of appropriately-doped silicon).

In the illustrated embodiment, the channel material pillars 28 are configured as annular rings, and insulative material 31 is within such rings. The insulative material 31 may comprise any suitable composition(s); and in some embodiments may comprise, consist essentially of, or consist of silicon dioxide. The illustrated configuration of the channel material pillars may be considered to be a hollow-pillar configuration, with the insulative material 31 being formed within the "hollows" of the pillars 28. In other embodiments, the pillars 28 may be configured as solid configurations rather than the illustrated hollow configurations.

Figure 5B:
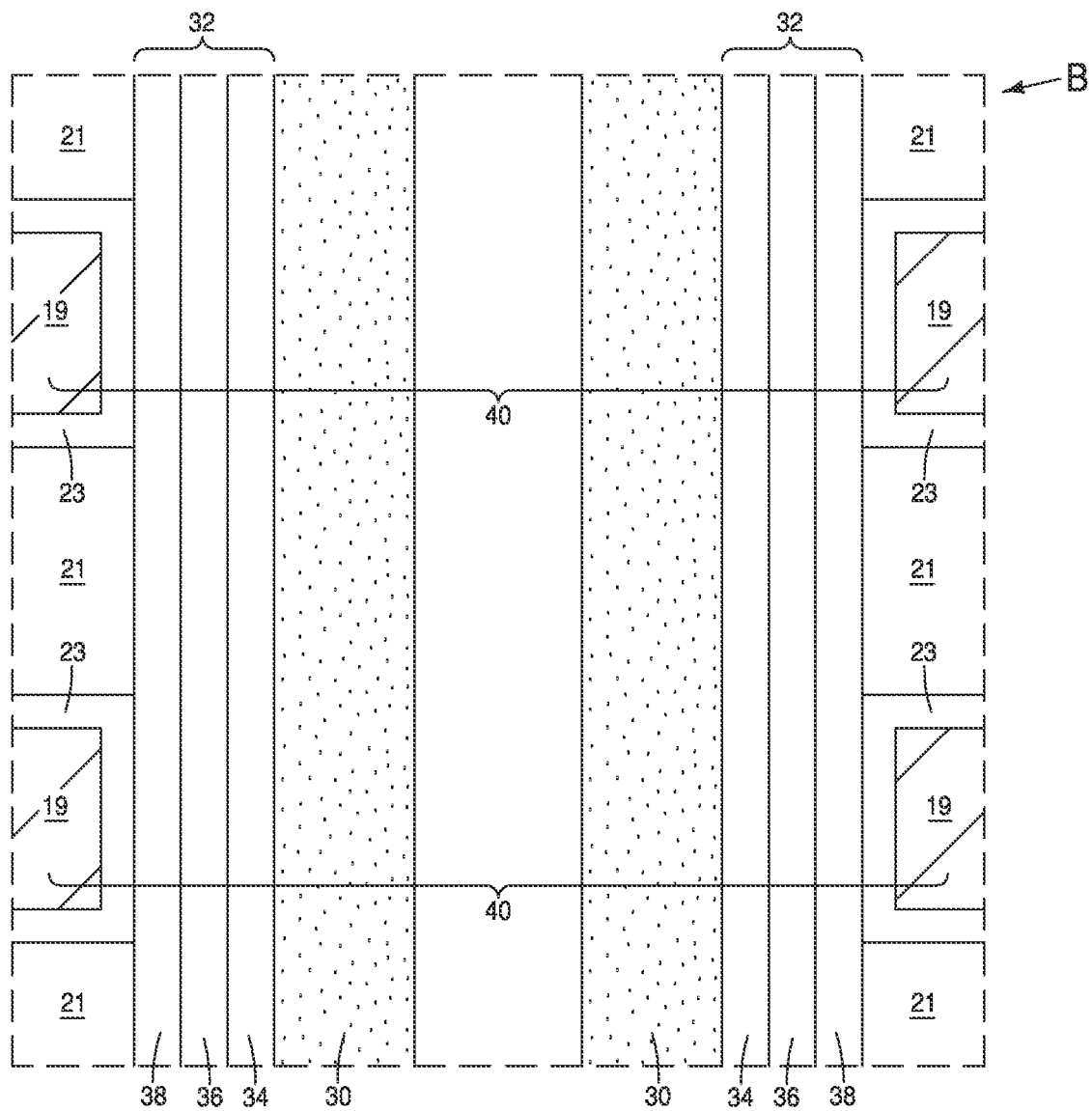
FIG. 5B is an enlarged view of a region "B" of FIG. 5A.

The channel material 30 is spaced from the stack 16 by intervening regions 32. FIG. 5B shows an expanded region "B" of FIG. 5A, and shows that the intervening regions 32 may comprise gate dielectric material 34, charge-trapping material 36 and charge-blocking material 38.

The gate dielectric material (tunneling material) 34 may comprise any suitable composition(s); such as, for example, one or more of silicon dioxide, silicon nitride, silicon oxynitride, etc. In some embodiments, the gate dielectric material 34 may be bandgap-engineered to achieve desired tunneling properties.

The charge-trapping material 36 may comprise any suitable composition(s); and in some embodiments may comprise, consist essentially of, or consist of silicon nitride.

The charge-blocking material 38 may comprise any suitable composition(s); and in some embodiments may comprise, consist essentially of, or consist of one or more of silicon dioxide, silicon oxynitride, etc.

Vertically-stacked memory cells 40 (only some of which are labeled in FIG. 5A) are along the conductive wordline levels 18. Such memory cells may be arranged in vertical NAND strings of the types described in FIGS. 1-4.

The channel material 30 of the channel-material pillars 32 is electrically coupled with the semiconductor-containing material 24 of the conductive structure 22. Source-select-devices (e.g., source-side select gates, SGSs) may be provided between the stack 16 and the source structure 22. Such source-select devices are not shown in FIG. 5A.

The channel material pillars 32 may be arranged within the sub-blocks (Sub-block$_1$ and Sub-block$_2$) in any suitable configurations; and in some embodiments may be in a tightly-packed arrangement, such as, for example, a hexagonally-packed arrangement.

The conductive structure (source structure) 22 is supported by a semiconductor base 42. The base 42 may comprise semiconductor material; and may, for example, comprise, consist essentially of, or consist of monocrystalline silicon. The base 42 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 42 may correspond to a semiconductor substrate containing one or more materials associated with integrated circuit fabrication. Such materials may include, for example, one or more of refractory metal materials, barrier materials, diffusion materials, insulator materials, etc.

The conductive structure 22 is shown to be electrically coupled with CMOS (complementary metal oxide semiconductor). The CMOS may be in any suitable location relative to the conductive structure 22, and in some embodiments at least some of the CMOS may be under such conductive structure. The CMOS may comprise logic and/or other appropriate circuitry for driving the source structure 22 during operation of memory associated with the stack 16. Although the circuitry is specifically identified to be CMOS in the embodiment of FIG. 5A, it is to be understood that at least some of such circuitry could be replaced with other suitable circuitry in other embodiments.

In some embodiments, the semiconductor material 24 may be considered to be configured as a first structure 44, and the panel 12 may be considered to be configured as a second structure 46. The second structure 46 contacts the first structure 44; and in the shown embodiment extends into, but not entirely through, the first structure 44. The first and second structures 44 and 46 join to one another along an interface 47.

The semiconductor material 24 of the first structure 44 may be conductively-doped. For instance, the semiconductor material may comprise n-type silicon having n-type dopant therein to a concentration of at least about $10^{20}$ atoms/cm$^3$. The n-type dopant may include one or both of phosphorus and arsenic. Alternatively, the semiconductor material may comprise p-type silicon having p-type dopant therein to a concentration of at least about $10^{20}$ atoms/cm$^3$. The p-type dopant may include boron.

The first structure 44 has a composition 48 proximate the interface 47, with such composition being diagrammatically illustrated with stippling. The composition 48 may include additive provided to a concentration within a range of from about $10^{18}$ atoms/cm$^3$ to about $10^{21}$ atoms/cm$^3$. The additive may include one or more of carbon, oxygen, nitrogen and sulfur. The composition 48 may thus include the semiconductor material 24, the conductivity-enhancing dopant (e.g., one or more of boron, phosphorus, arsenic, etc.), and the additive.

In the illustrated embodiment, the composition 48 is only within a region of the semiconductor-material-containing structure 44 proximate the interface 47, and is not within regions of the structure 44 distal from such interface.

In the illustrated embodiment of FIG. 5A, the semiconductor-material-containing structure 44 is part of the source structure 22, and is directly against the metal-containing material 36 of the source structure. The second structure 46 (i.e., the panel 12) extends into the semiconductor-material-containing structure 44, but does not extend entirely through such structure to contact the metal-containing structure 36. In some embodiments the composition 48 may be provided to slow an etch through the semiconductor material 24 (as described below relative to example methods of fabricating example assemblies) so that the metal-containing material 36 is not exposed. Such may preclude problematic galvanic corrosion of the semiconductor material 24 associated with conventional fabrication processes.

Although the panel 12 is shown extending into the semiconductor-material-containing structure 44, it is to be understood that in other embodiments the panel 12 may extend to an upper surface of the semiconductor-material-containing structure 44 without penetrating into the semiconductor-material-containing structure.

The illustrated embodiment of FIGS. 5 and 5A shows the panel 12 comprising only the insulative material 14. In other embodiments (described below with reference to FIG. 24) the panel 12 may include conductive material in addition to the insulative material.

The assembly 10 of FIGS. 5-5B may be formed with any suitable processing. Example processing is described with reference to FIGS. 6-23.

Figure 6:
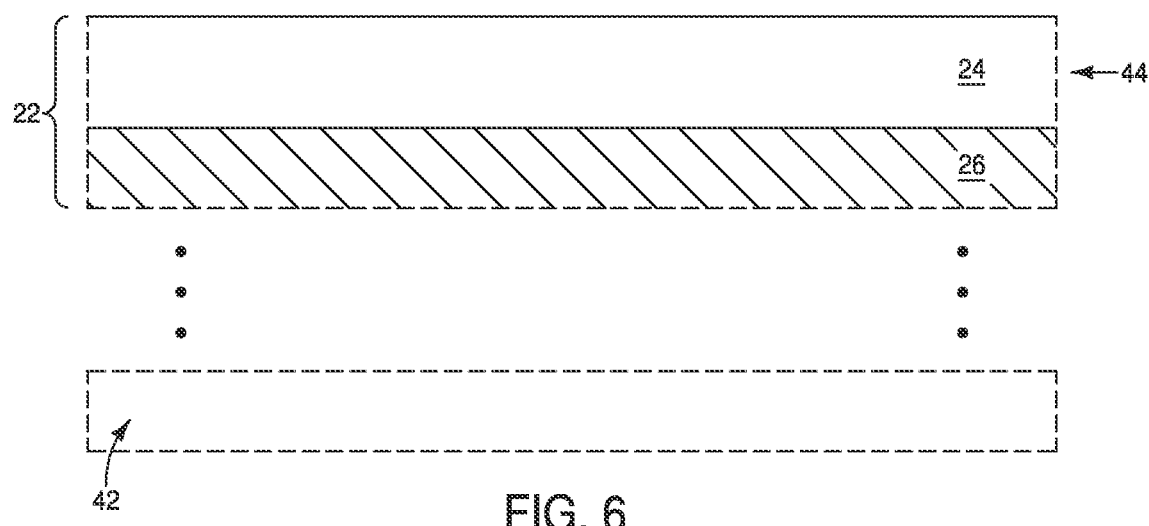
FIGS. 6-8 are diagrammatic cross-sectional side views of a region of an example structure at sequential process stages of an example method.

Referring to FIG. 6, the source structure 22 is formed over the base 42. The semiconductor material 24 of the source structure 22 may be conductively doped with n-type dopant or p-type dopant, and is configured as the semiconductor-material-containing structure 44.

The source structure 22 may or may not be coupled with CMOS at the process stage of FIG. 6 (with example coupling to CMOS being shown in FIG. 5A).

Figure 7:
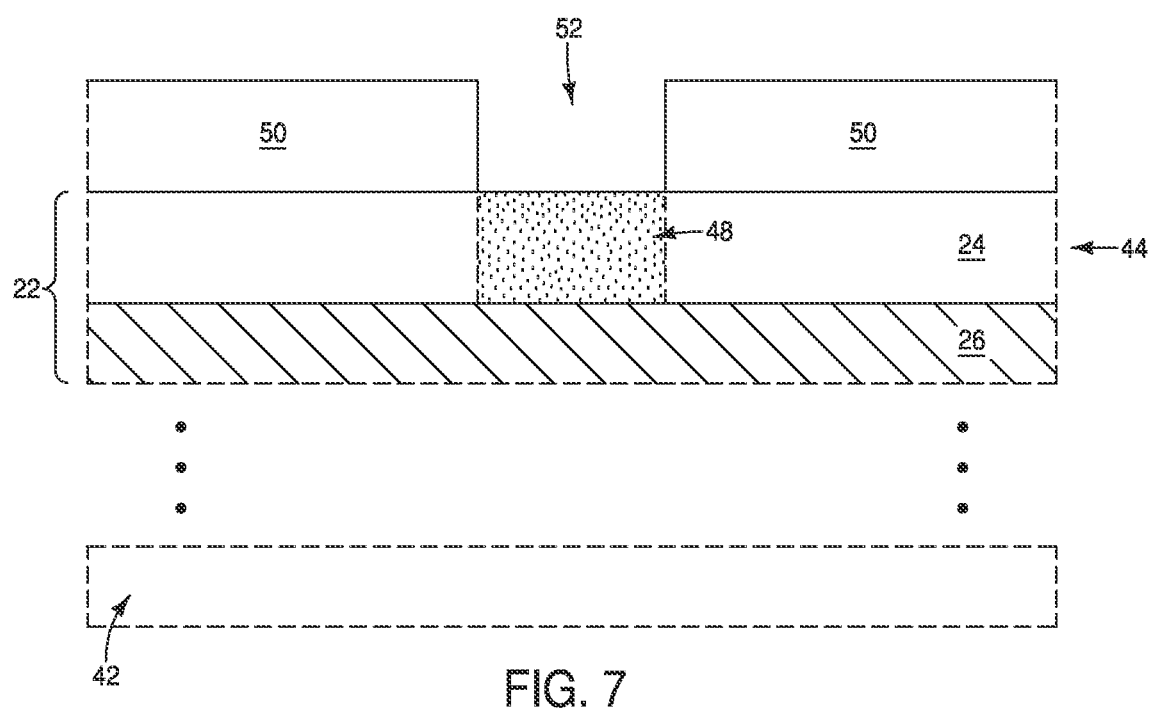

Referring to FIG. 7, masking material 50 is formed over the semiconductor-material-containing structure 44, with such masking material being patterned to expose a region 52 of the structure 44. The additive is provided within such exposed region to form the composition 48 within the semiconductor material 24 of the semiconductor-material-containing structure 44. The additive may comprise one or more of carbon, oxygen, nitrogen and sulfur; and may be provided to a concentration within a range of from about $10^{18}$ atoms/cm$^3$ to about $10^{21}$ atoms/cm$^3$. In some embodiments, the additive may comprise, consist essentially of, or consist of carbon.

Figure 8:
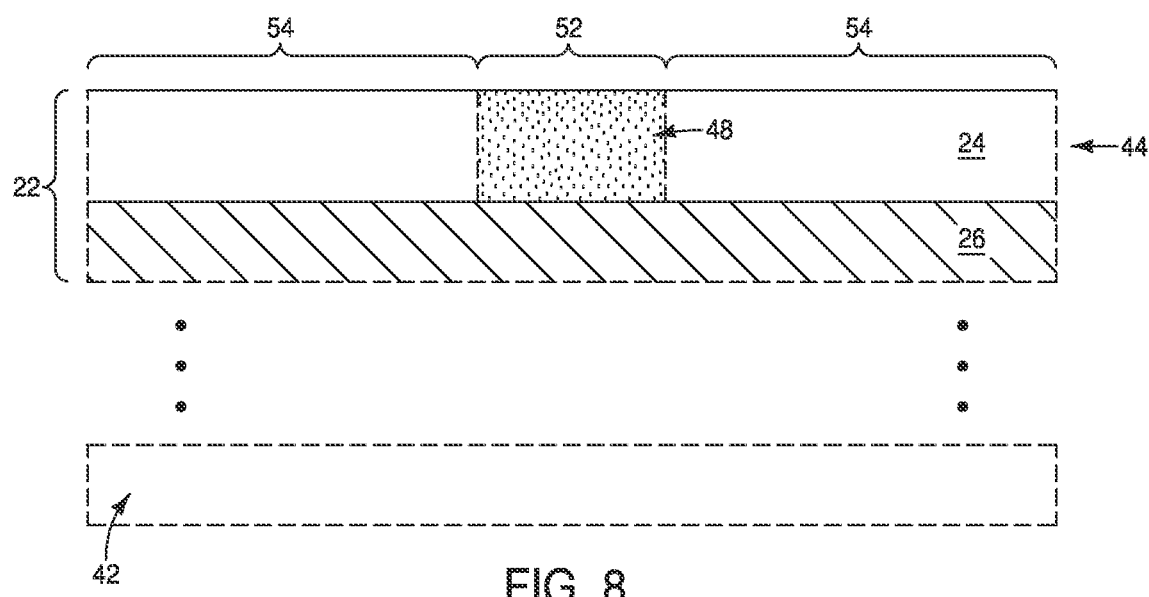

Referring to FIG. 8, the masking material 50 is removed. The composition 48 is within the region 52 of the semiconductor-material-containing structure 44, and is not within other regions 54 of the semiconductor-material-containing structure 44.

Figure 9:
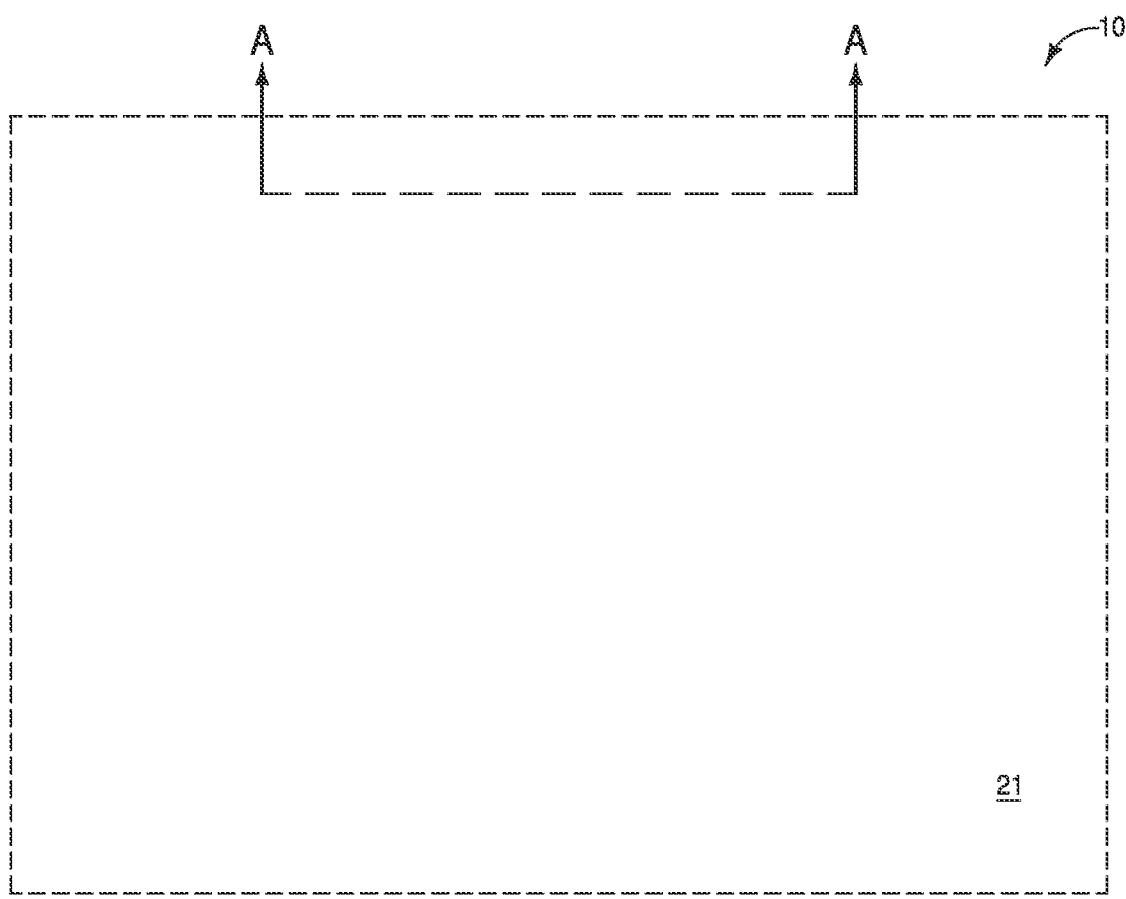
FIGS. 9 and 9A are views of a region of an integrated assembly illustrating an example architecture, with such example architecture comprising the example structure of FIG. 8.
Figure 9A:
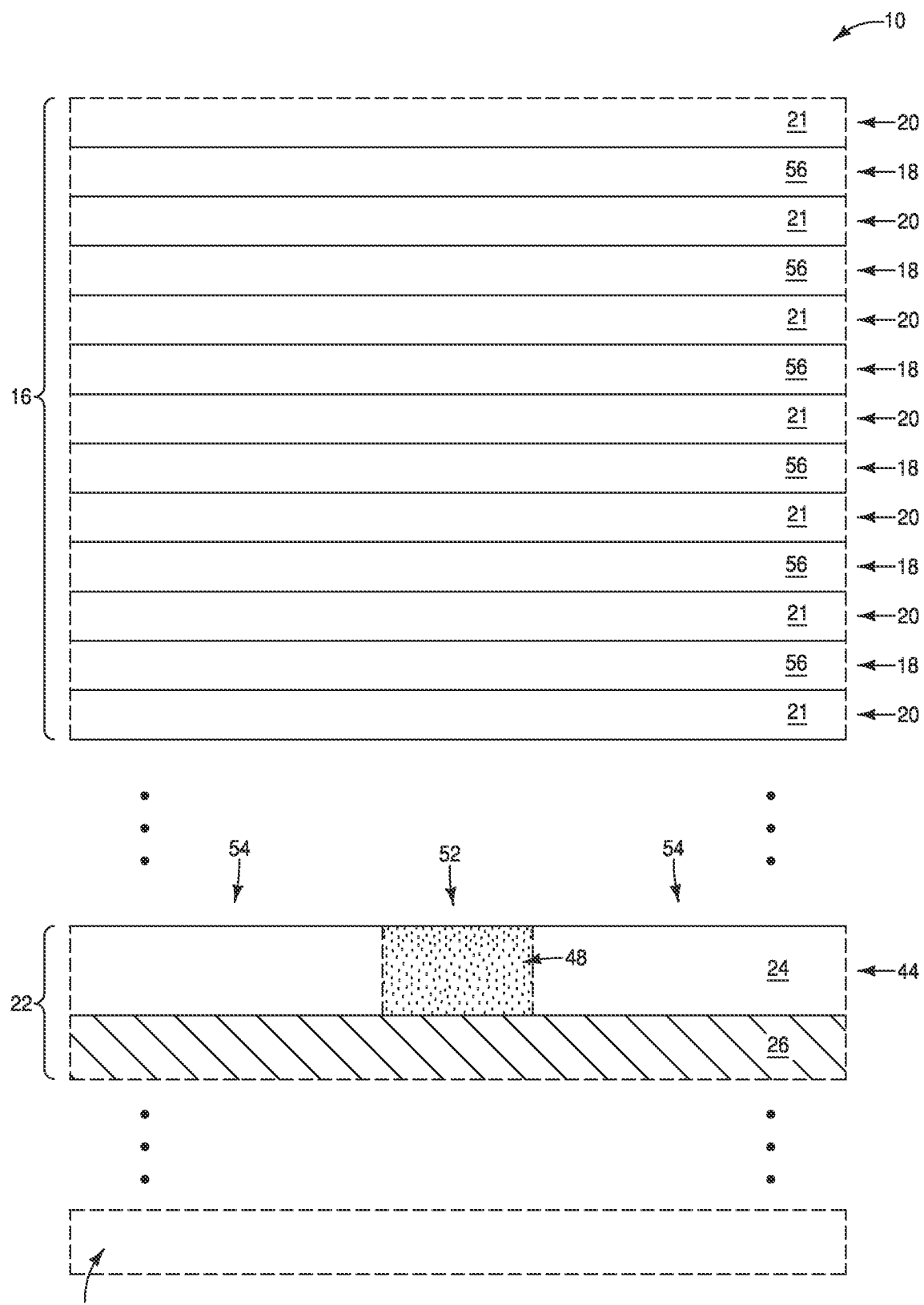

Referring to FIGS. 9 and 9A, a stack 16 is formed over the source structure 22. The stack 16 has alternating first and second levels 18 and 20. The first levels 18 comprise a sacrificial material 56, and the second levels 20 comprise the insulative material 21.

The stack 16, the source 22 and the base 42 are together comprised by an integrated assembly 10.

Figure 10:
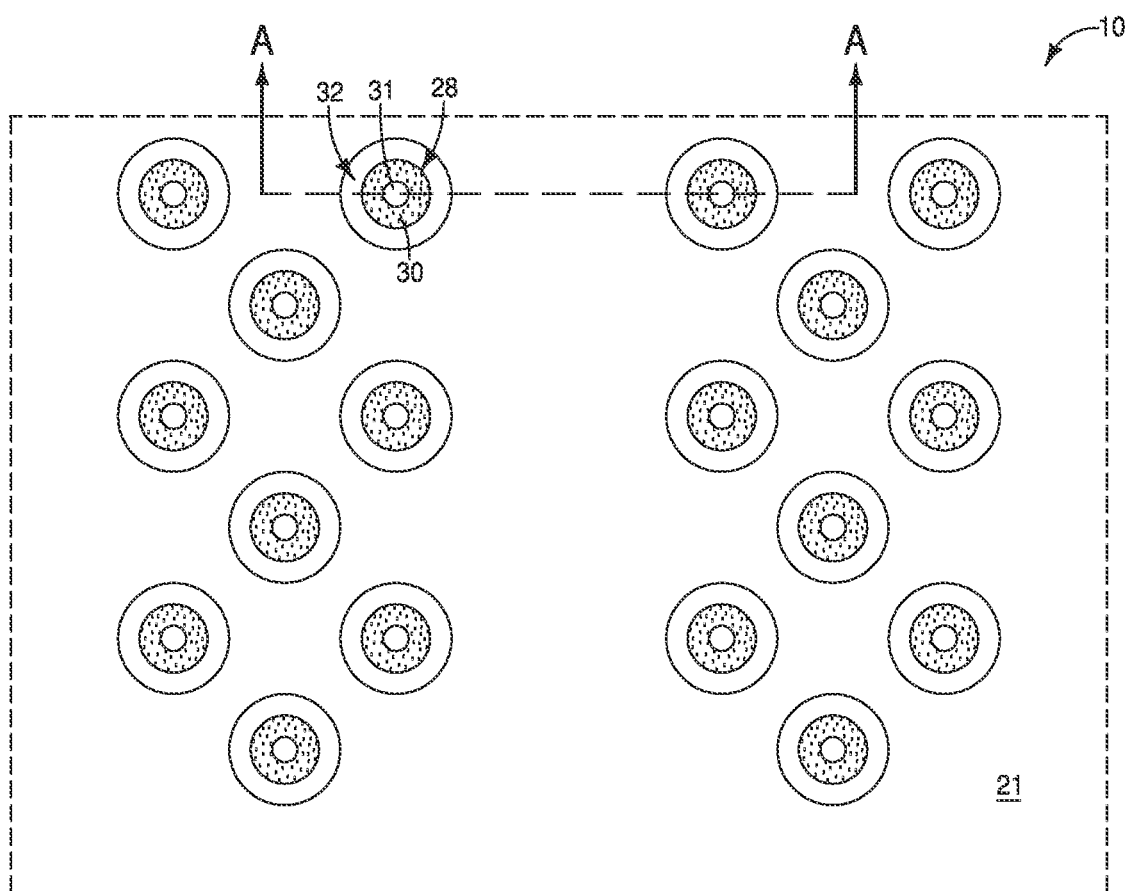
FIGS. 10 and 10A are views of the region of FIGS. 9 and 9A at an example process stage subsequent to that of FIGS. 9 and 9A.
Figure 10A:
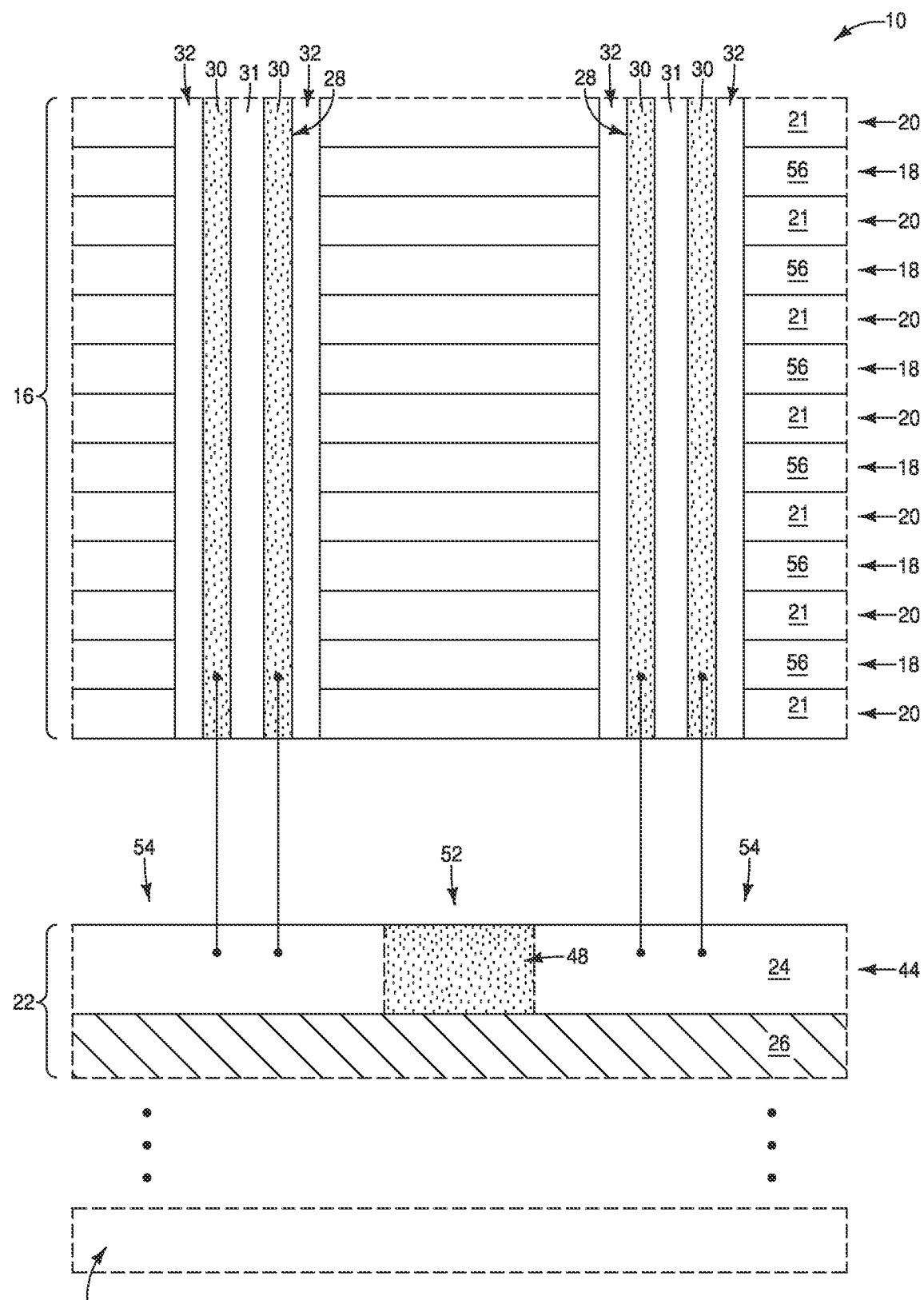

Referring to FIGS. 10 and 10A, the channel material pillars 28 are formed to extend through the stack 16. The channel material 30 of the channel material pillars 28 is electrically coupled with the source structure 22. The intervening regions 32 are provided adjacent the channel material 30, with such intervening regions comprising the charge-blocking material, charge-trapping material and tunneling material described above with reference to FIG. 5B.

Figure 11:
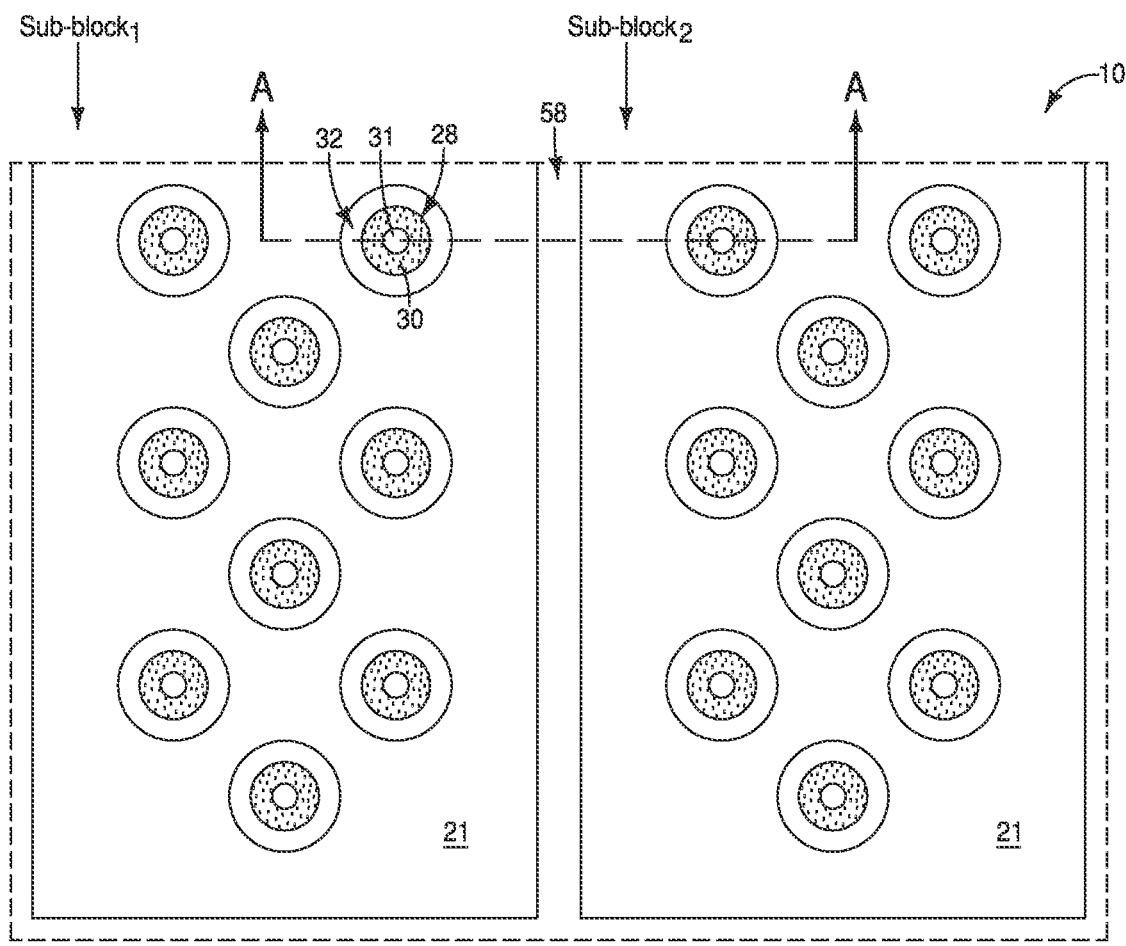
FIGS. 11 and 11A are views of the region of FIGS. 9 and 9A at an example process stage subsequent to that of FIGS. 10 and 10A.
Figure 11A:
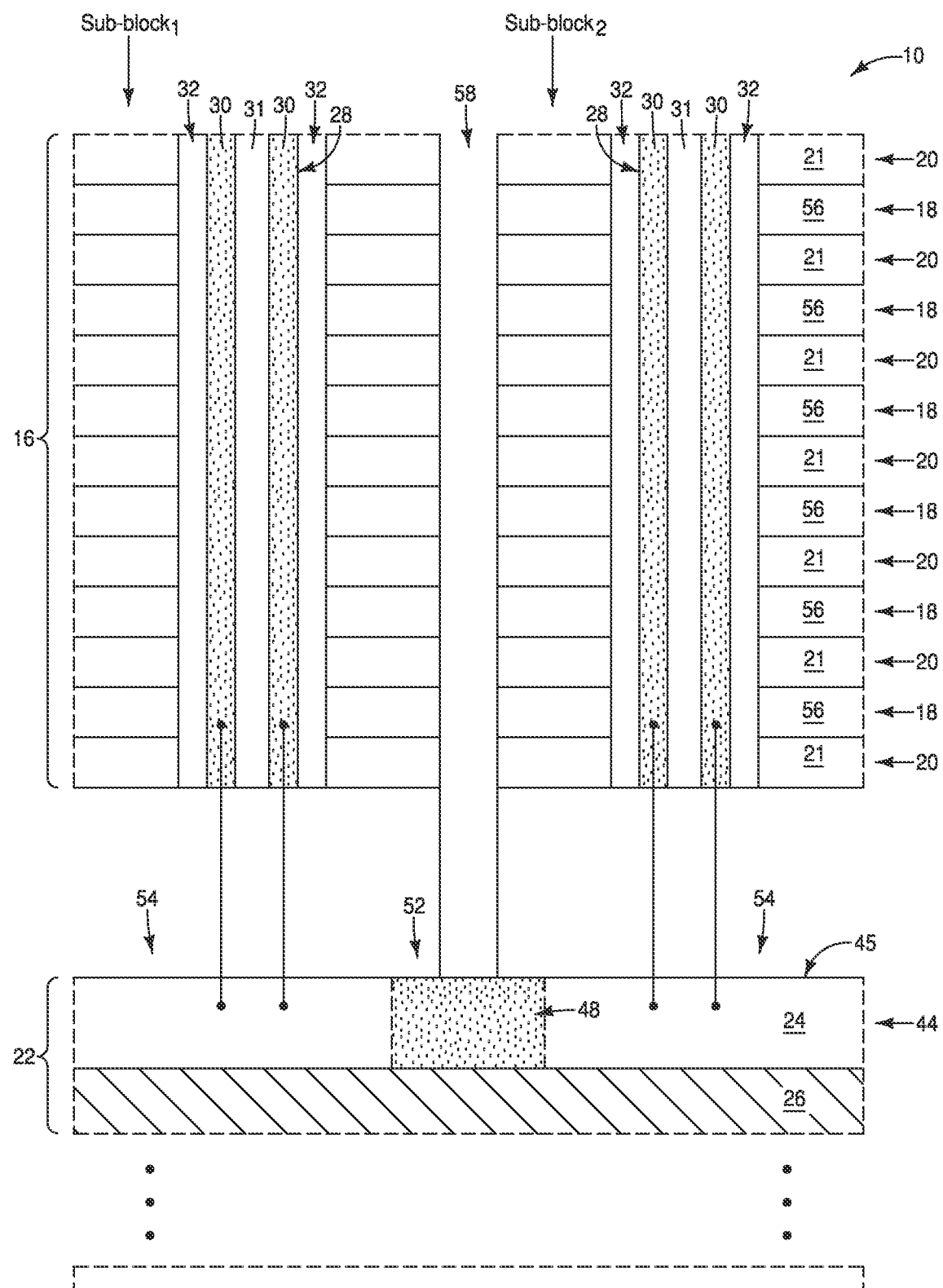

Referring to FIGS. 11 and 11A, a trench (slit) 58 is formed to extend through the stack 16 and to an upper surface 45 of the semiconductor-material-containing structure 44. The trench 58 extends to the region 52 comprising the composition 48. The trench 58 subdivides Sub-block$_1$ and Sub-block$_2$ from one another. The trench 58 may be considered to be an example of an opening which is formed to extend to the upper surface 45 of the semiconductor-material-containing structure 44. In other embodiments, other types of openings may be formed.

The trench 58 is shown stopping on the upper surface 45 of the semiconductor-material-containing structure 44 as would occur if an etch utilized to form the trench 58 is selective for the materials of stack 16 relative to the composition 48 of the semiconductor-material-containing structure 44. In other embodiments the etch utilized to penetrate the stack 16 may less selective relative to the composition 48 than illustrated, and the trench may extend into the semiconductor-material-containing structure 44. In some embodiments (discussed below with reference to FIGS. 16-19) an etch-stop may be provided over the surface 45 to assist in stopping the trench 58 at a desired location.

Figure 12:
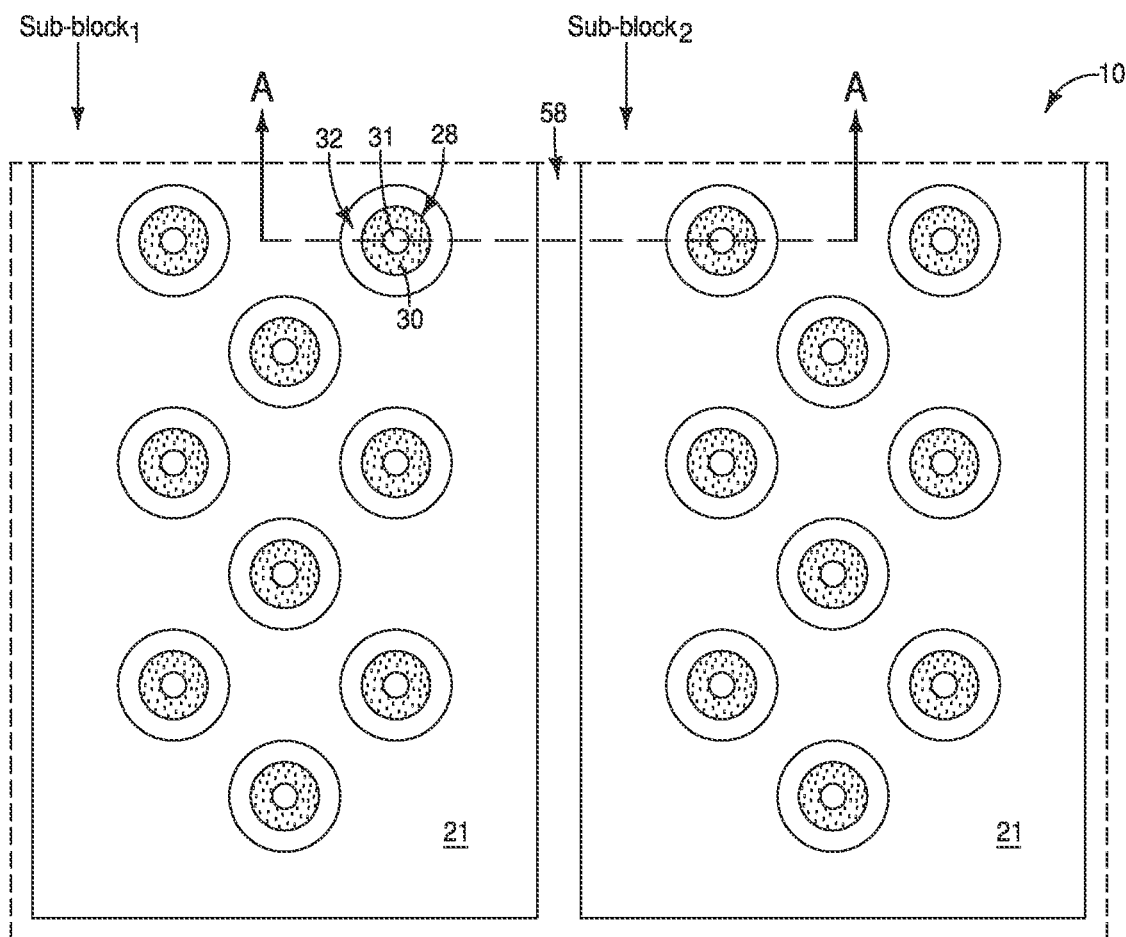
FIGS. 12 and 12A are views of the region of FIGS. 9 and 9A at an example process stage subsequent to that of FIGS. 11 and 11A.
Figure 12A:
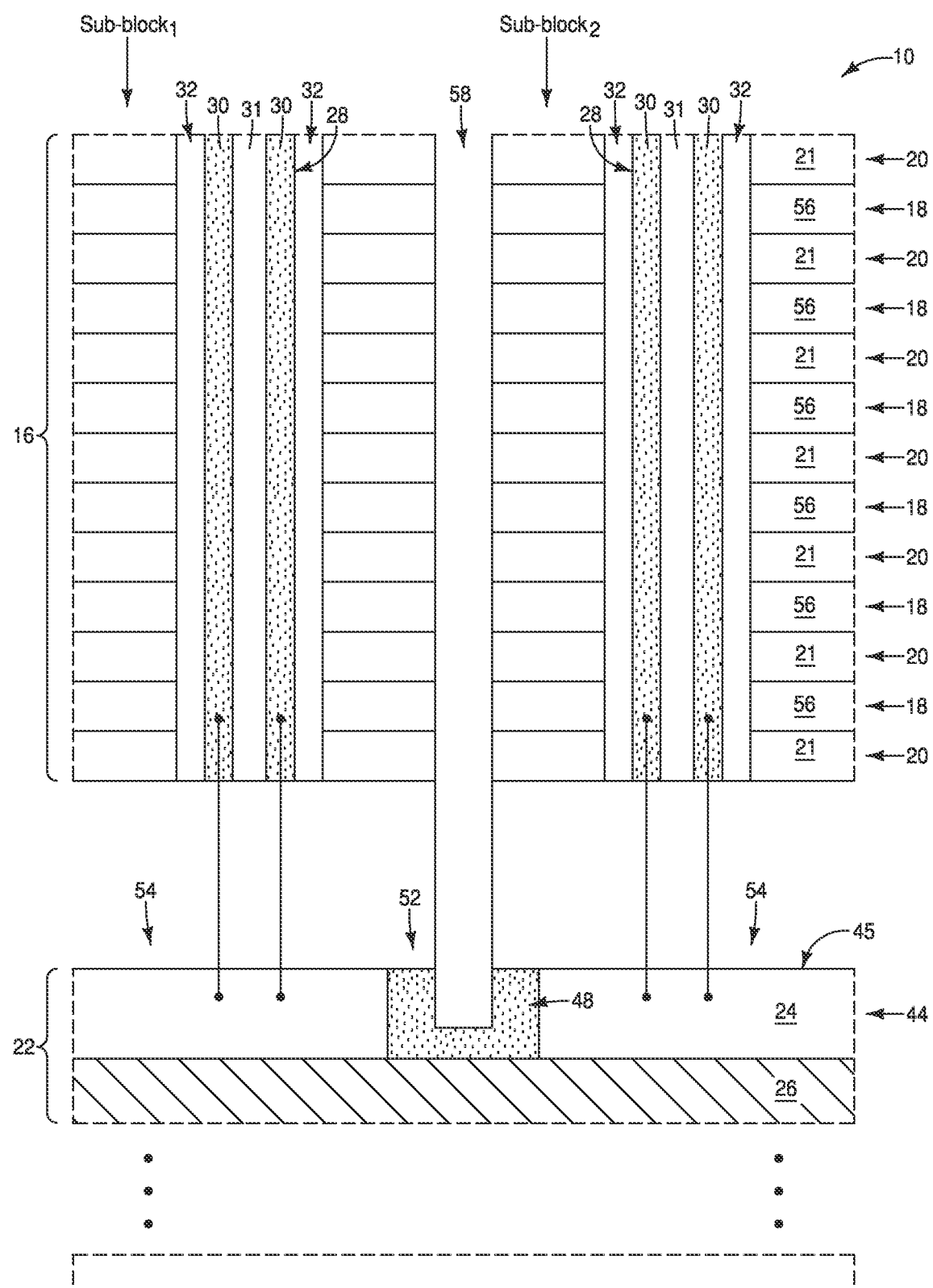

Referring to FIGS. 12 and 12A, the trench 58 is extended into the composition 48 with one or more suitable etches. The trench 58 extends into the semiconductor material 24 of the structure 44, but does not extend entirely through such semiconductor material; and accordingly does not expose the metal-containing material 26. In some embodiments, the process stage of FIGS. 12 and 12A may be omitted, so that the trench 58 remains at the upper surface 45 of the semiconductor-containing-material structure 44 prior to a subsequent phosphoric acid etch described below with reference to FIGS. 13 and 13A. Such phosphoric acid etch may or may not extend the trench 58 partially into the composition 48, as described in more detail below with reference to FIGS. 13 and 13A. It is to be understood that the process stage of FIGS. 12 and 12A is provided to assist the reader in understanding that the slit 58 may extend into the composition 48 prior to the phosphoric acid etch of FIGS. 13 and 13A, and may or may not correspond to an actual process stage. For instance, in some embodiments the process stage of FIGS. 11 and 11A may not have the slit 58 stopping cleanly on the upper surface of the semiconductor-containing material 24, and thus the process stage of FIGS. 12 and 12A may be understood to simply be illustrating a later time interval of the same etch utilized to form the slit 58 of FIGS. 11 and 11A.

Figure 13:
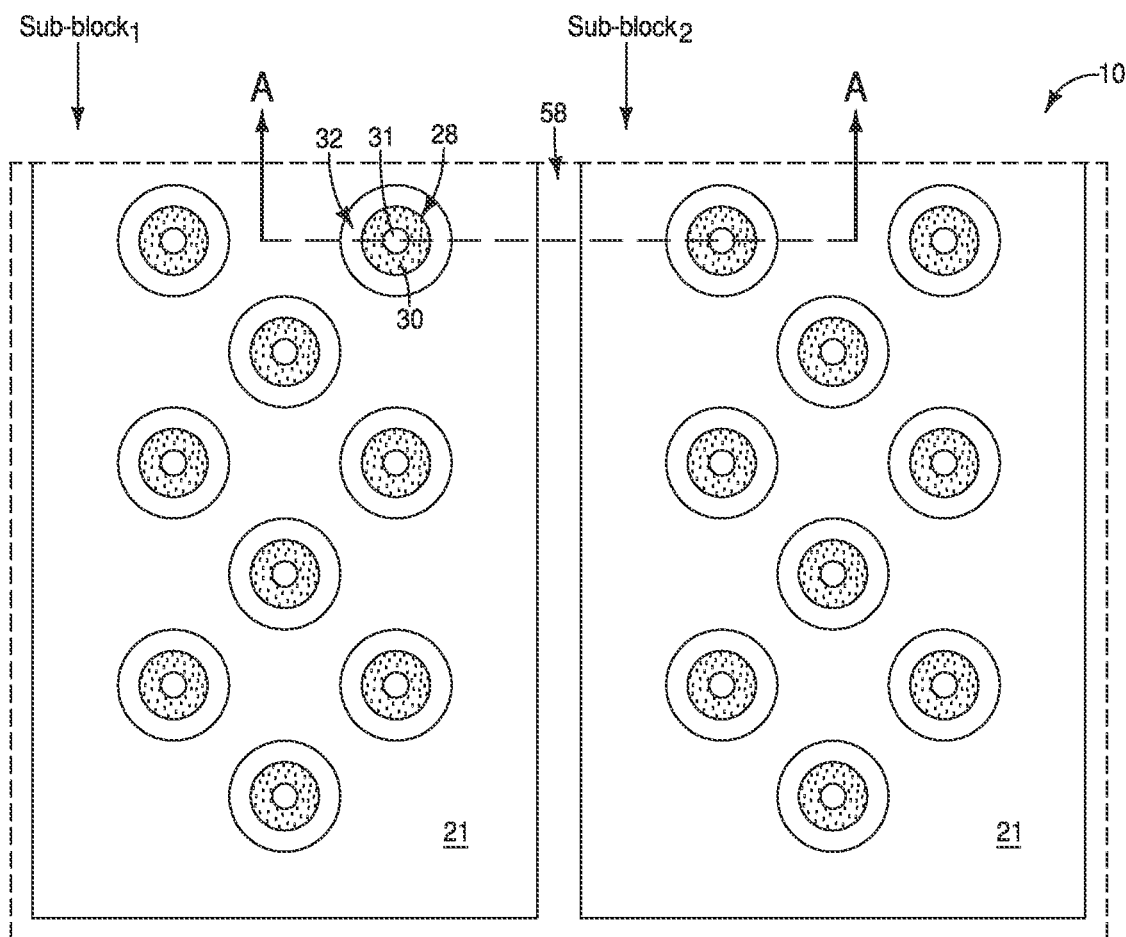
FIGS. 13 and 13A are views of the region of FIGS. 9 and 9A at an example process stage subsequent to that of FIGS. 12 and 12A.
Figure 13A:
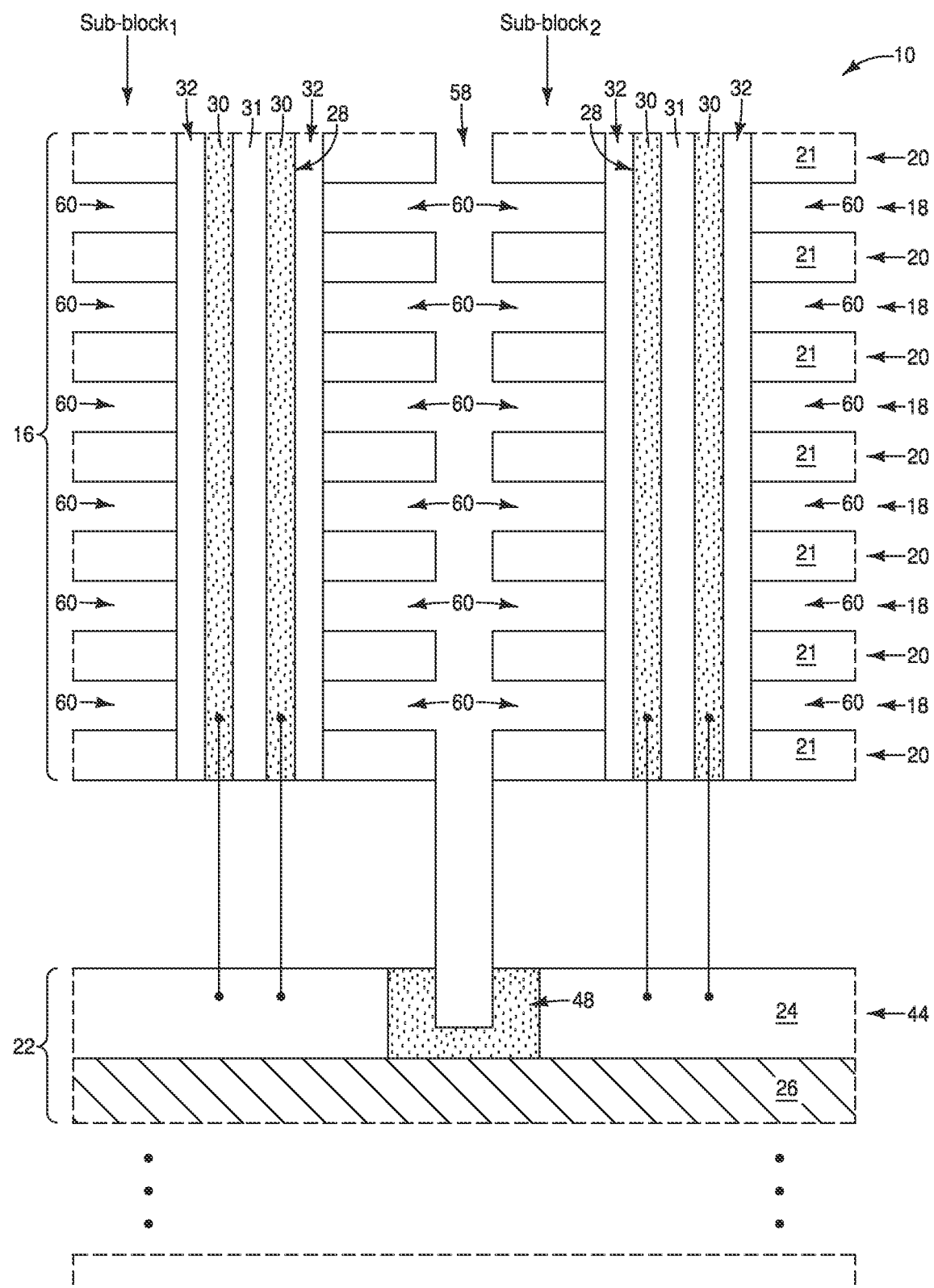

Referring to FIGS. 13 and 13A, the sacrificial material 56 (FIG. 11A) is removed to form voids 60 along the levels 18. In some embodiments, the sacrificial material 56 may comprise, consist essentially of, or consist of silicon nitride, and may be removed with a hot phosphoric acid etch. Such etch may utilize any suitable conditions. For instance, the etch may be conducted at a temperature within a range of from about 100° C. to about 200° C., for a duration of from about one hour to about four hours, utilizing a solution comprising from about 0.1% to about 100% concentrated phosphoric acid (H$_3$PO$_4$). The etch may be conducted at any suitable pressure, including, for example, atmospheric pressure.

The composition 48 is resistant to the hot phosphoric acid etch. Specifically, the additive (i.e., one or more of carbon, nitrogen, oxygen and sulfur) modifies the properties of the semiconductor material 24 so that such semiconductor material becomes more resistant to the hot phosphoric acid etch than it would be in the absence of the additive. The trench 58 may or may not punch further into the composition 48 during the hot phosphoric acid etch depending on the conditions of the etch, the dimensions of the trench, the composition and concentration of the additive within the composition 48, etc. Regardless, the additive within the composition 48 may prevent the trench 58 from extending entirely through the semiconductor-material-containing structure 44, and may thereby preclude exposure of the metal-containing material 26 within the trench 58. In conventional processing, the metal-containing material 26 may be exposed, and such may lead to undesired galvanic corrosion of the semiconductor material 24. The additive within the composition 48 may preclude such undesired galvanic corrosion by precluding excessive etching of the semiconductor-containing-structure 44 during the removal of sacrificial material 56 (FIG. 11A) and may thereby preclude the problematic exposure of the metal-containing material 26.

Figure 14:
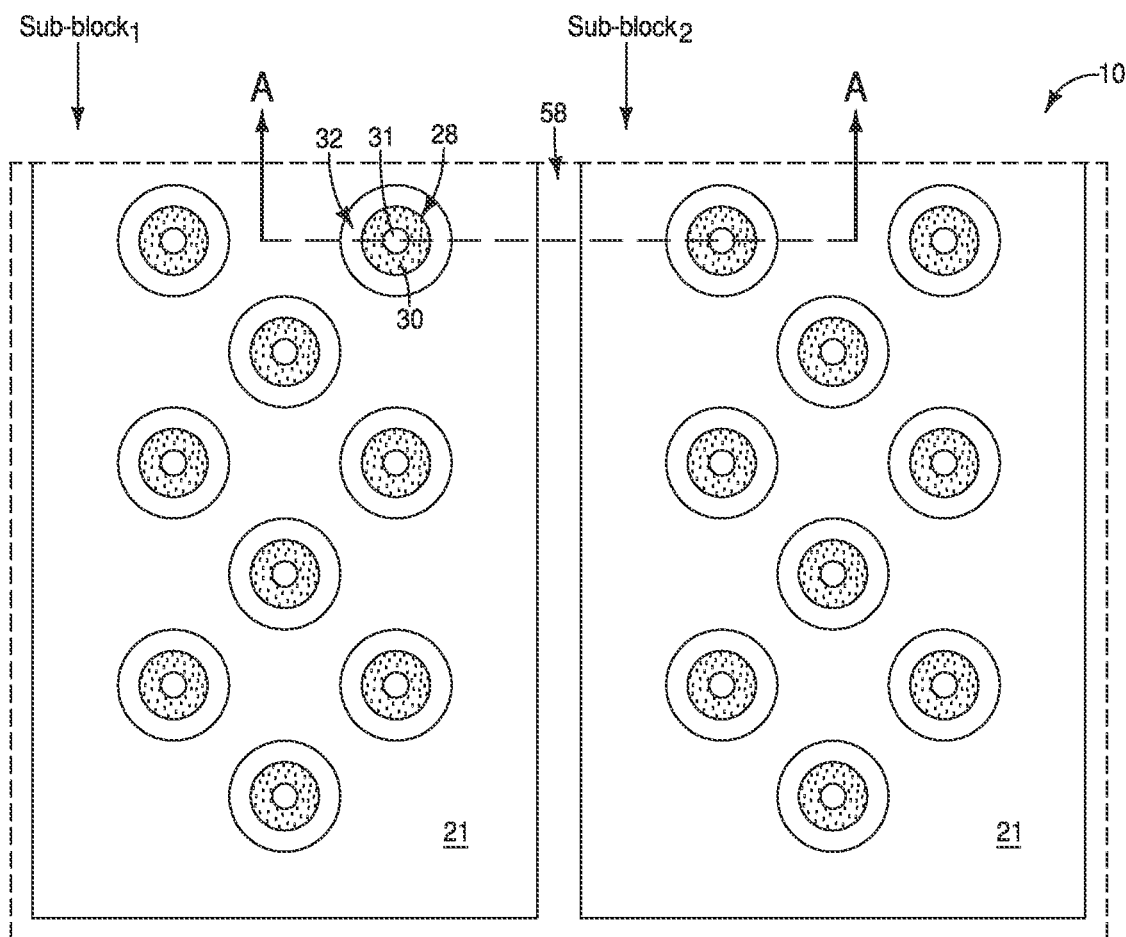
FIGS. 14 and 14A are views of the region of FIGS. 9 and 9A at an example process stage subsequent to that of FIGS. 13 and 13A.
Figure 14A:
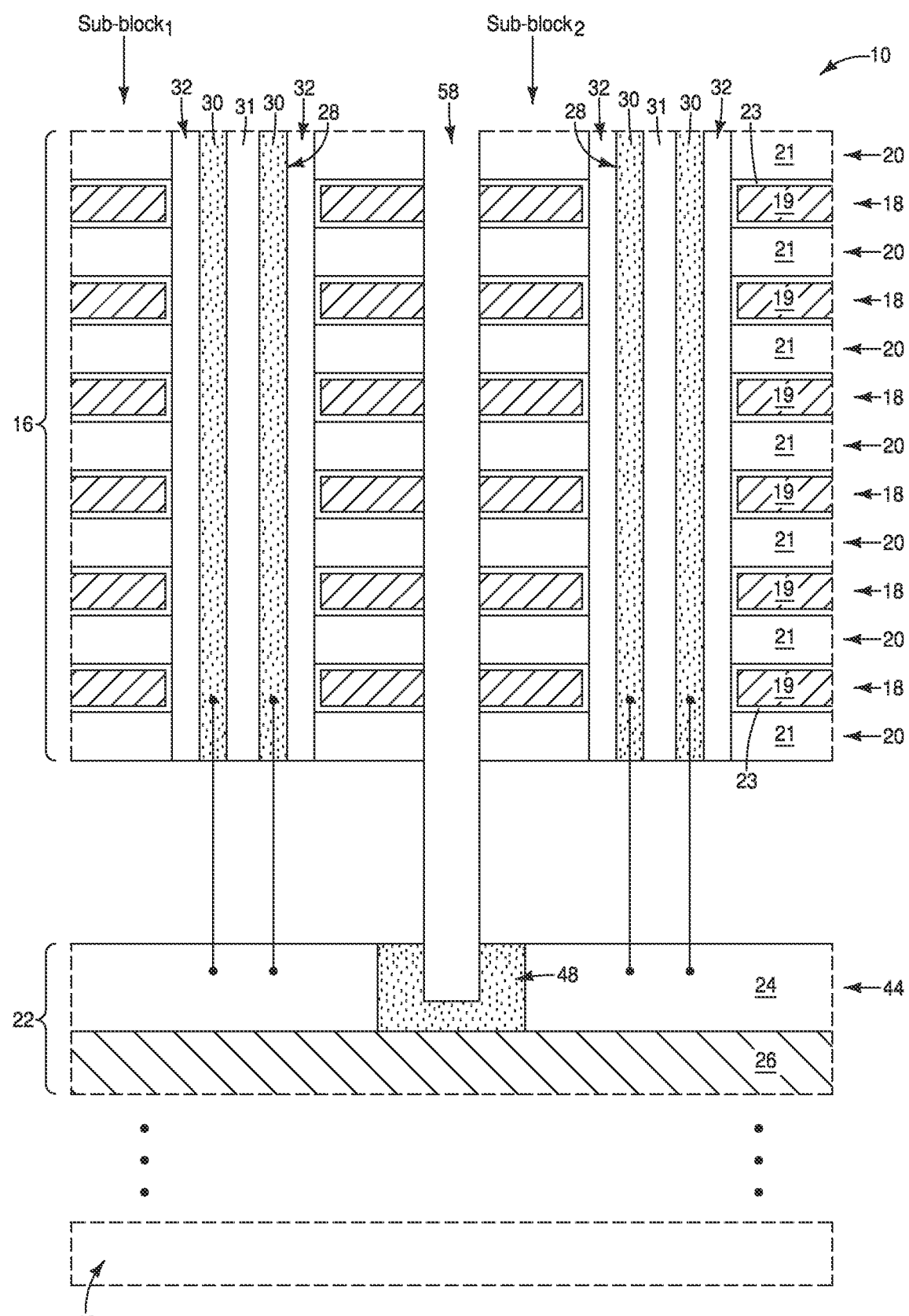

Referring to FIGS. 14 and 14A, the dielectric barrier material 23 is formed within the voids 60 (FIG. 13A) to line the voids, and then the conductive material 19 is formed within the lined voids.

Figure 15:
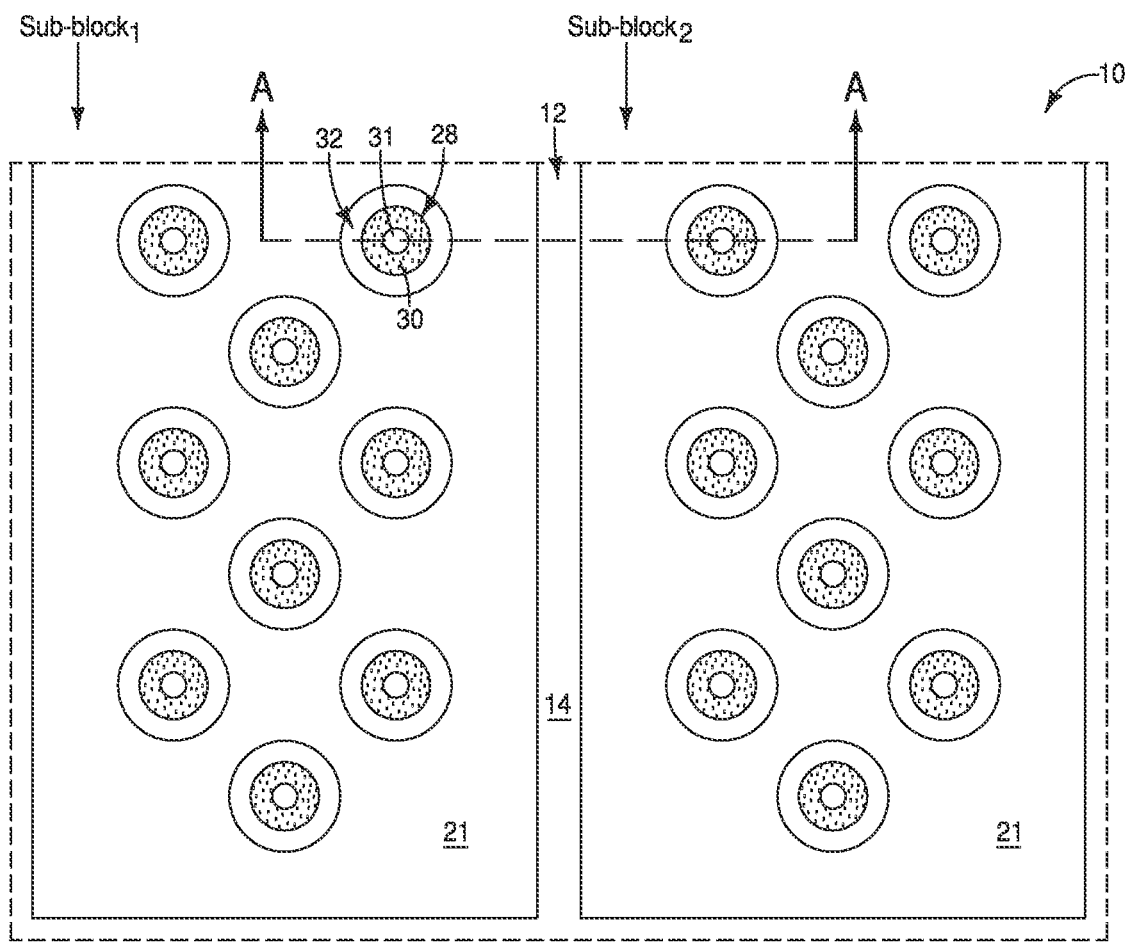
FIGS. 15 and 15A are views of the region of FIGS. 9 and 9A at an example process stage subsequent to that of FIGS. 14 and 14A.
Figure 15A:
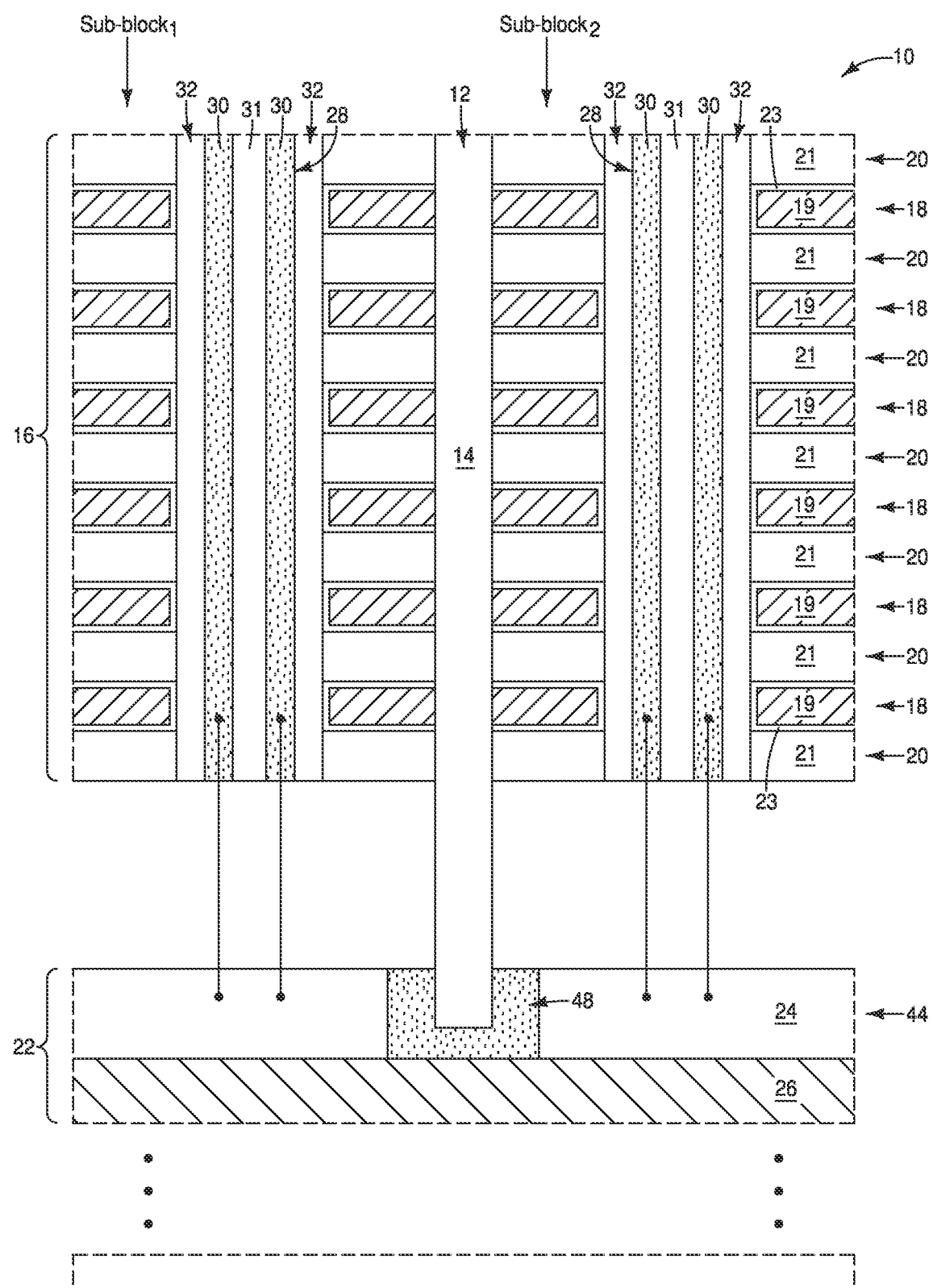

Referring to FIGS. 15 and 15A, the panel material 14 is formed within the trench 58 (FIGS. 14 and 14A) to form the panel 12 separating Sub-block$_1$ from Sub-block$_2$. The assembly 10 of FIGS. 15 and 15A is identical to that described above with service to FIGS. 5 and 5A. The CMOS connection of FIGS. 5 and 5A is not shown in FIGS. 15 and 15A, but such connection may be formed at any suitable process stage.

In some embodiments, the insulative panel material 14 may be referred to as a second insulative material to distinguish it from the first insulative material 21 of the stack 16.

Figure 16:
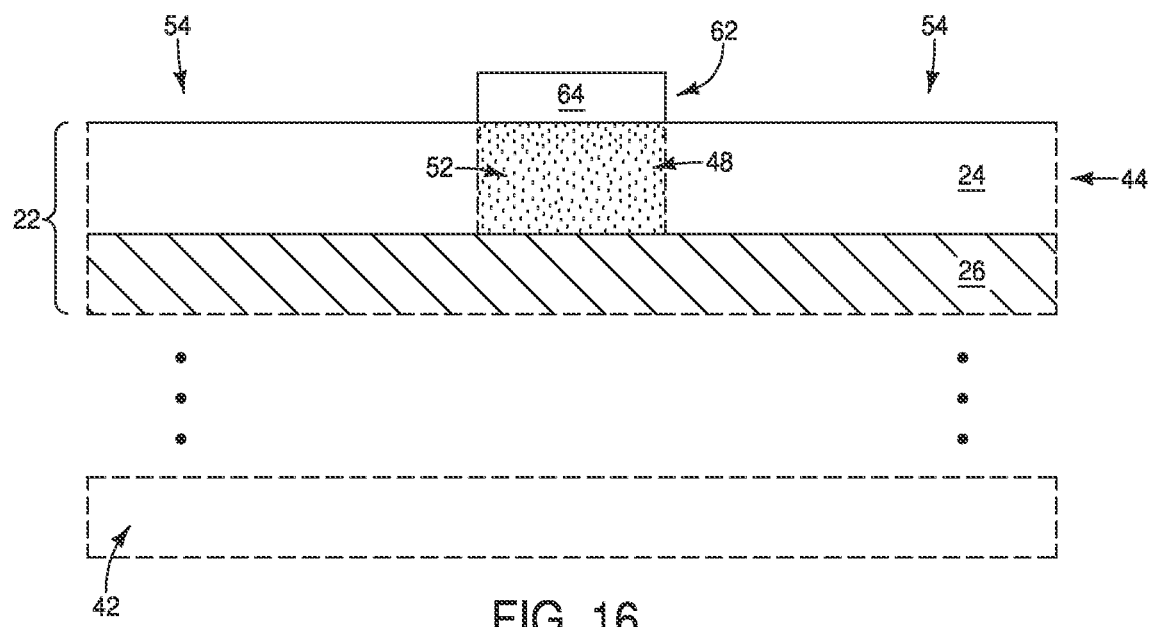
FIG. 16 is a diagrammatic cross-sectional side view of a region of an example structure at an example process stage which may follow the process stage of FIG. 8.

In some embodiments, an etch-stop may be utilized to assist in avoiding overpenetration of the trench 58 (FIGS. 11 and 11A) into the semiconductor-material-containing structure 44. For instance, FIG. 16 shows a process stage which may follow that of FIG. 8, and shows an etch stop 62 provided over the composition 48; and specifically provided over the region 52 of the semiconductor-material-containing structure 44.

The etch-stop 62 comprises etch-stop material 64. Such material may comprise any suitable composition or combination of compositions. For instance, the etch-stop material 64 may include aluminum oxide, tungsten, etc.

Figure 17:
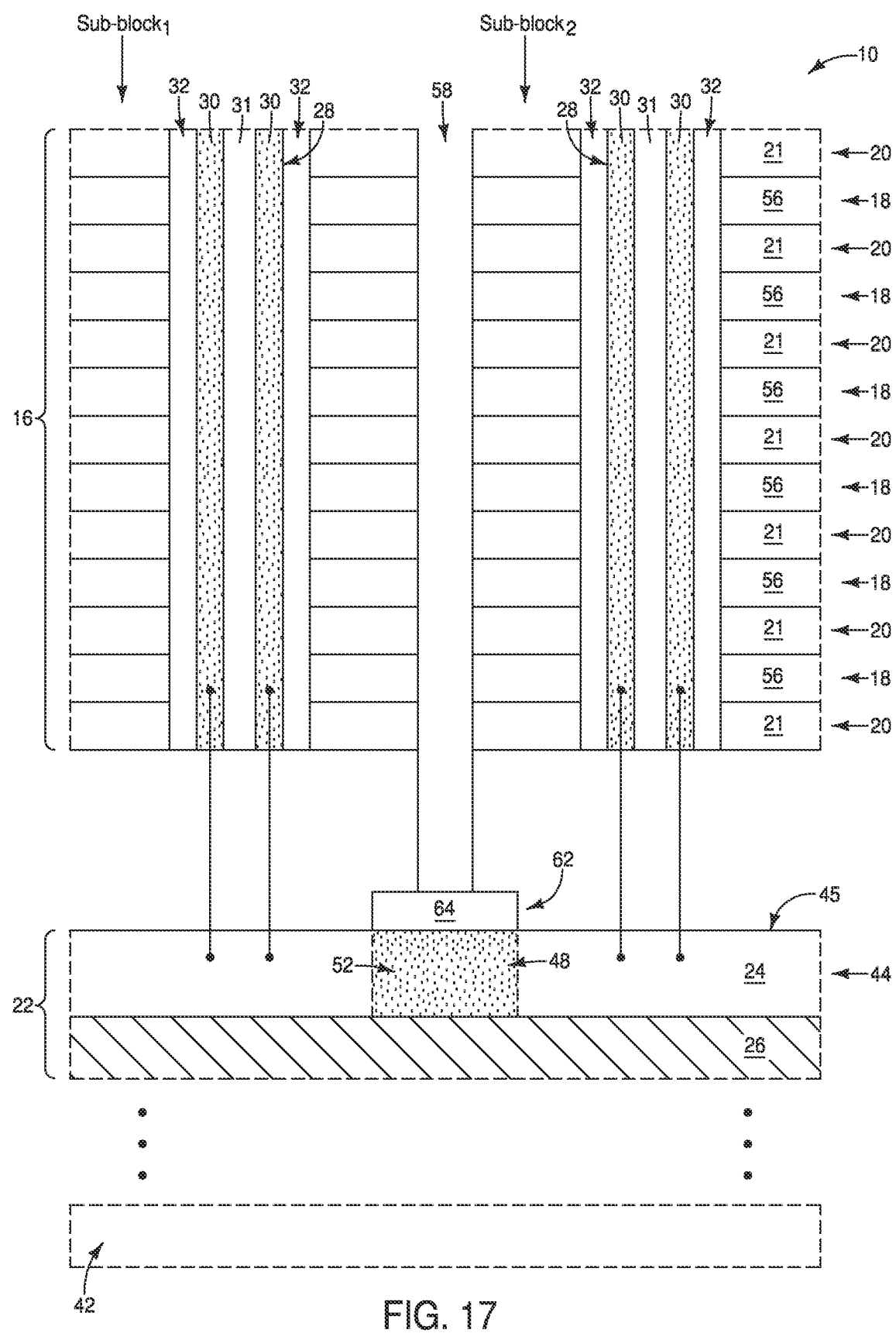
FIGS. 17-19 are diagrammatic cross-sectional side views of a region of an integrated assembly at sequential process stages of an example embodiment. The integrated assembly of FIG. 17 comprises the example structure of FIG. 16.

Referring to FIG. 17, the assembly 10 is shown at a process stage similar to that of FIG. 11A, except that the trench 58 stops at an upper surface of the etch stop 62.

Figure 18:
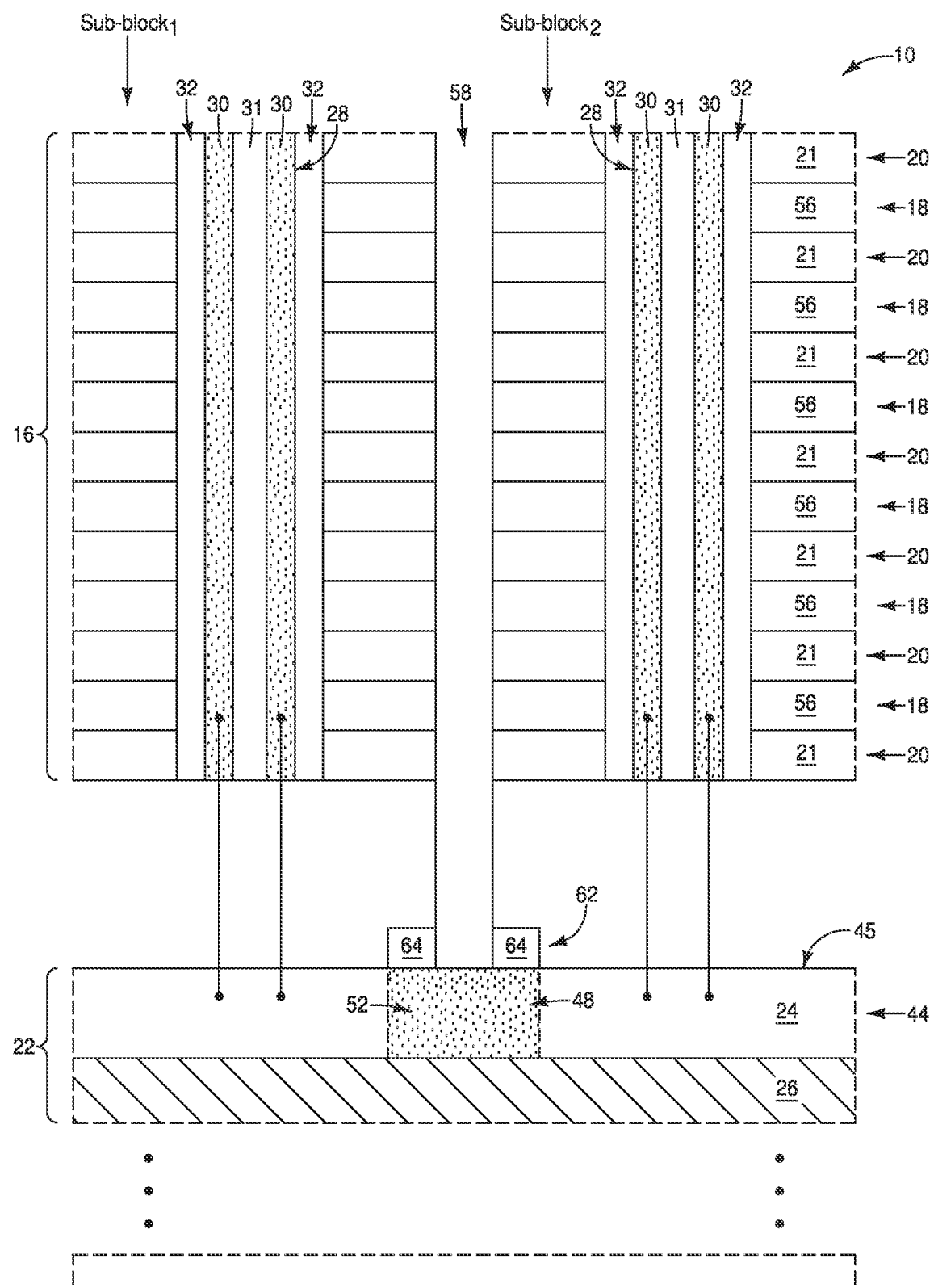

Referring to FIG. 18, the trench 58 is extended through the etch stop 62 to the upper surface 45 of the semiconductor-material-containing structure 44.

Figure 19:
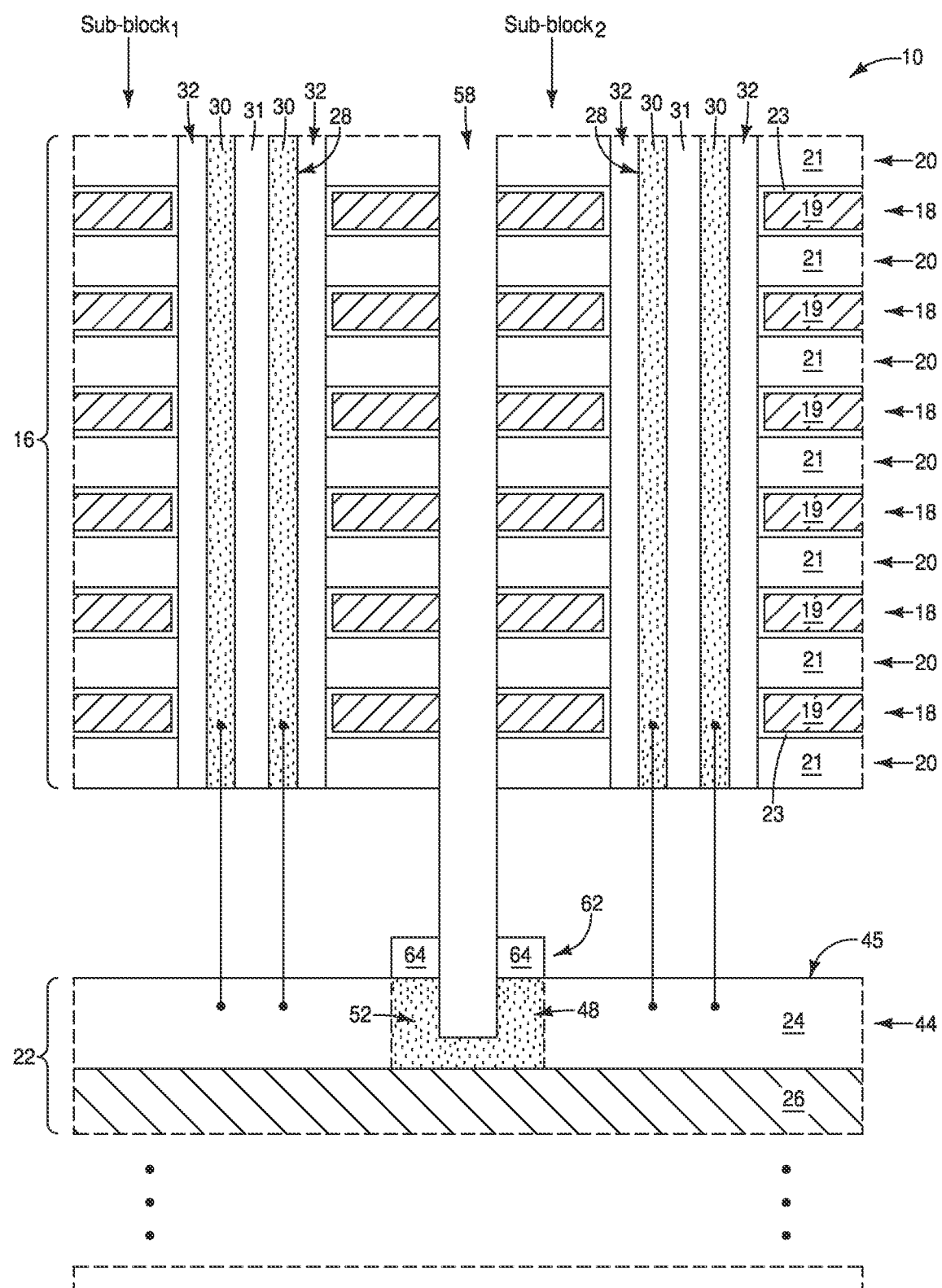

Referring to FIG. 19, the sacrificial material 56 (FIG. 18) is removed and replaced with the dielectric barrier material 23 and the conductive material 19 along the levels 18. The trench 58 extends partially into the semiconductor-material-containing structure 44 but does not extend entirely through such structure. The trench may be extended into the composition 48 during a hot phosphoric acid etch analogous to the etch described above with reference to FIGS. 13 and 13A. Alternatively, the trench may remain at the upper surface 45 of the semiconductor-material-containing structure 44, rather than penetrating into the composition 48. In subsequent processing (not shown), the panel material 14 (FIG. 5A) may be formed within the trench 58 of FIG. 19.

The embodiments described above form the composition 48 within the semiconductor material 24 prior to forming the trench 58. In other embodiments such composition may be formed within the semiconductor material after formation of the trench 48. An example of such other embodiments is described with reference to FIGS. 20-23.

Figure 20:
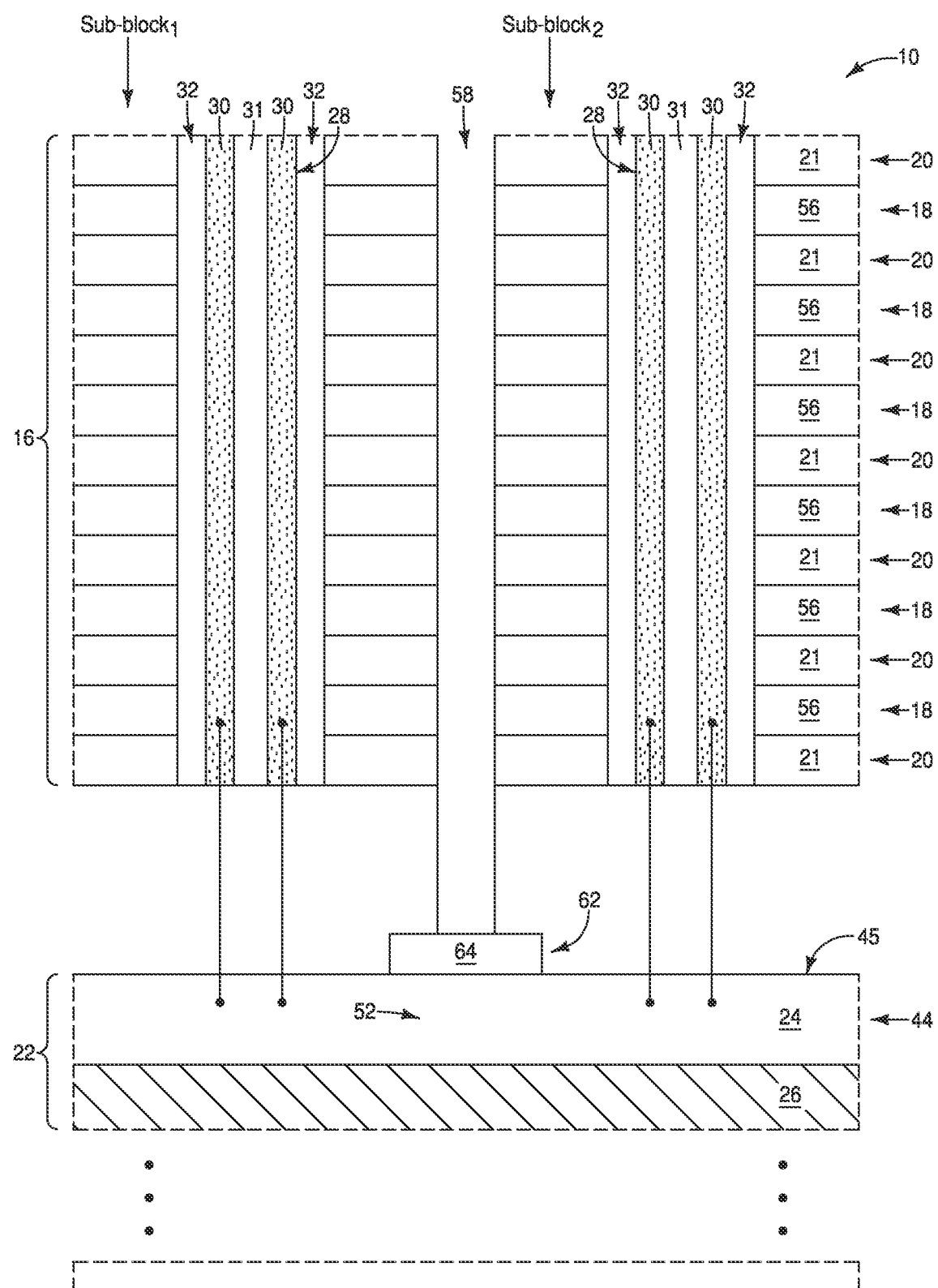
FIGS. 20-23 are diagrammatic cross-sectional side views of a region of an integrated assembly at sequential process stages of an example embodiment.

Referring to FIG. 20, the construction 10 is shown at a process stage analogous to that of FIG. 17, but the additive is not provided within the semiconductor material 24 of the semiconductor-material-containing structure 44, and accordingly the composition 48 (FIG. 17) is not yet present within the region 52 of the semiconductor-material-containing structure 44.

Figure 21:
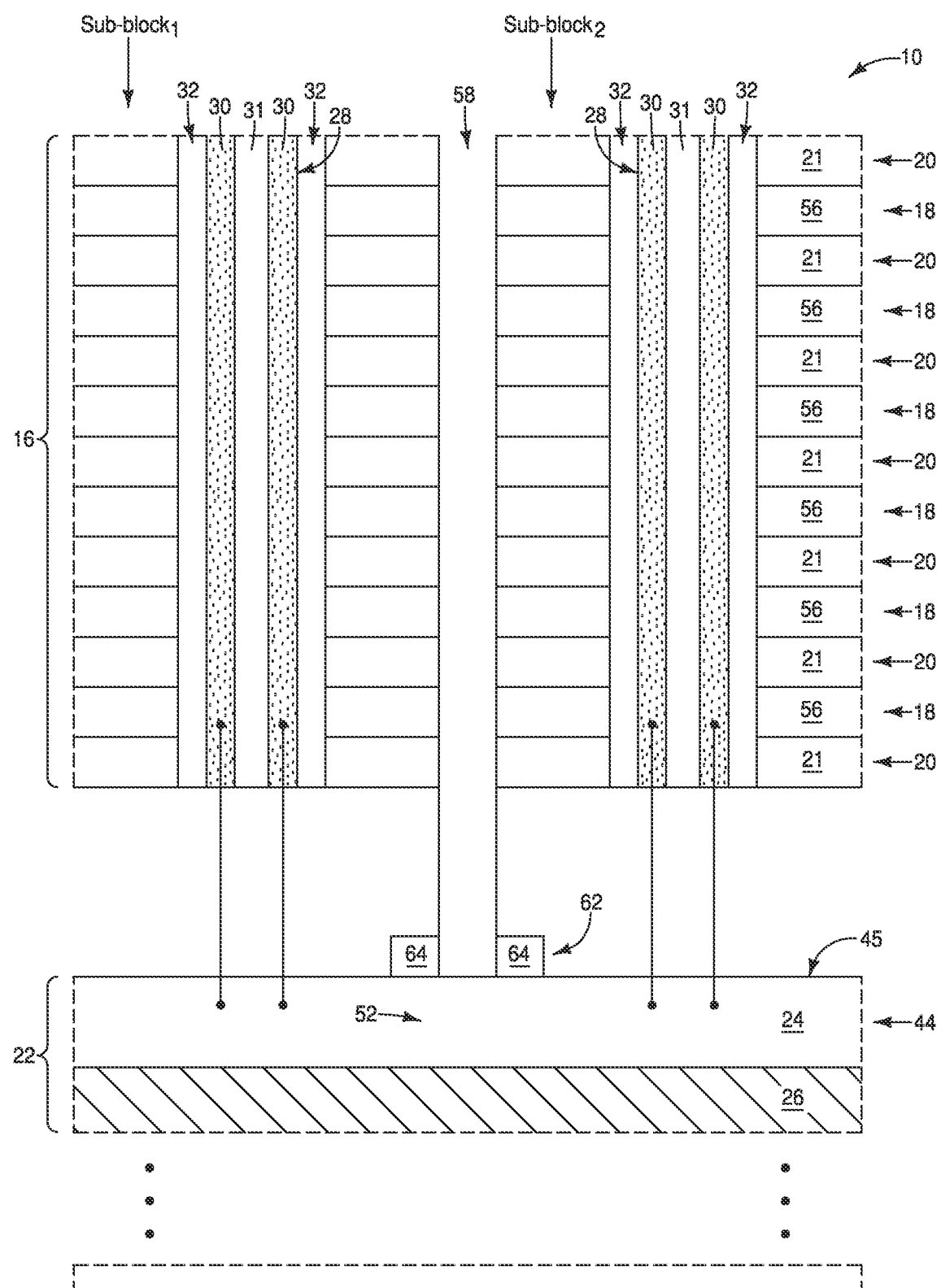

Referring to FIG. 21, the trench 58 is extended through the etch-stop material 64 to the upper surface 45 of the semiconductor-material-containing structure 44. In other embodiments, the etch-stop 62 may be omitted, and the process stage of FIG. 21 may be analogous to that described above with reference to FIG. 11A (but lacking the composition 48 within the region 52). Although the trench 58 is shown stopping at the upper surface 45 of the structure 44, in other embodiments the trench 58 may extend partially into the semiconductor material 24 of the structure 44.

Figure 22:
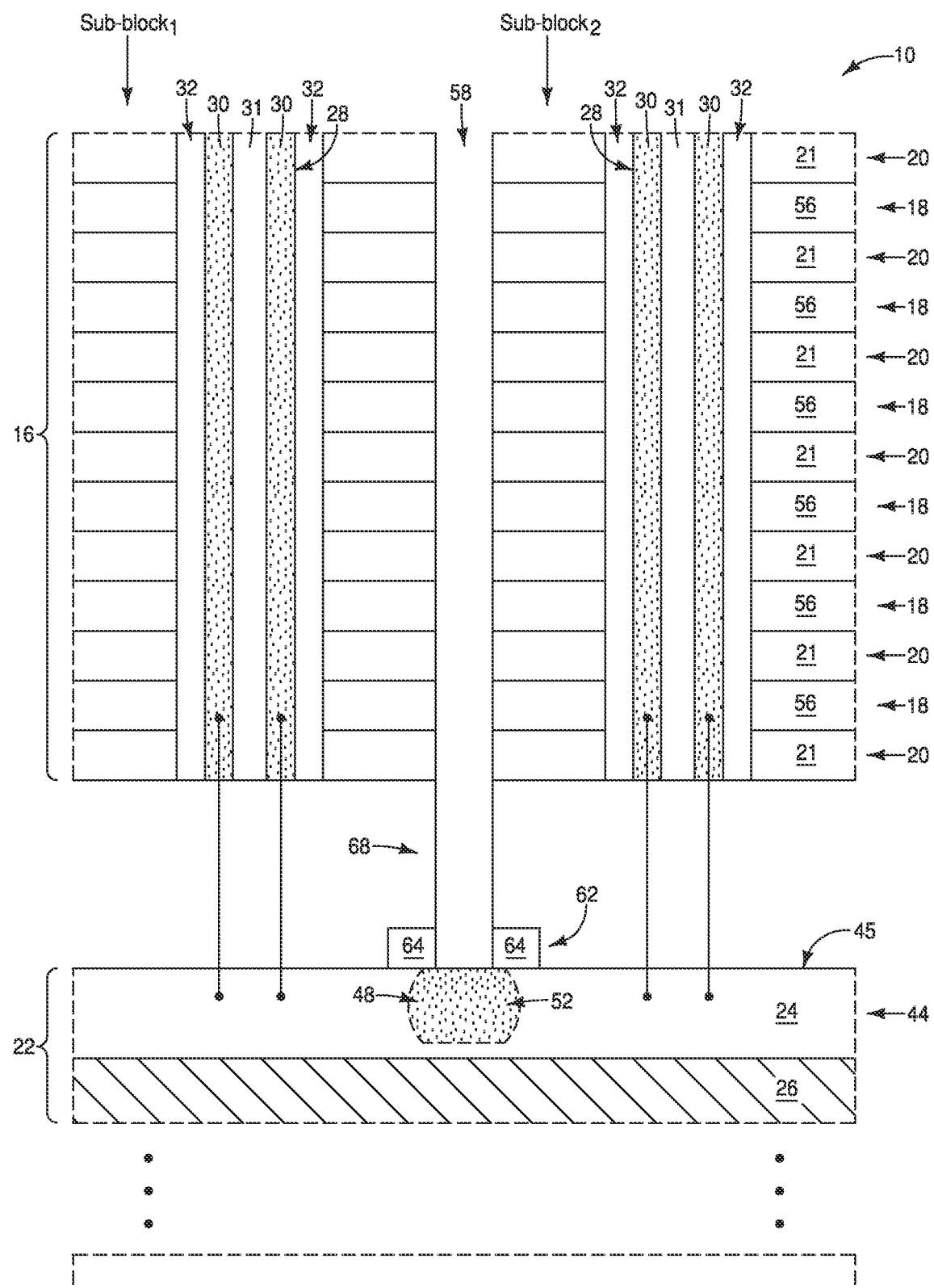

Referring to FIG. 22, the additive (i.e., one or more of carbon, sulfur, oxygen and nitrogen) is implanted into the semiconductor material 24 through the slit 58. Accordingly, the composition 48 is formed within the region 52. Such composition may include the additive containing one or more of carbon, sulfur, oxygen and nitrogen; with such additive being present to the concentration within the range of from about $10^{18}$ atoms/cm$^3$ to about $10^{21}$ atoms/cm$^3$. The composition 48 may also include conductivity-enhancing dopant (e.g., phosphorus, arsenic, boron, etc.) in addition to the additive.

Figure 23:
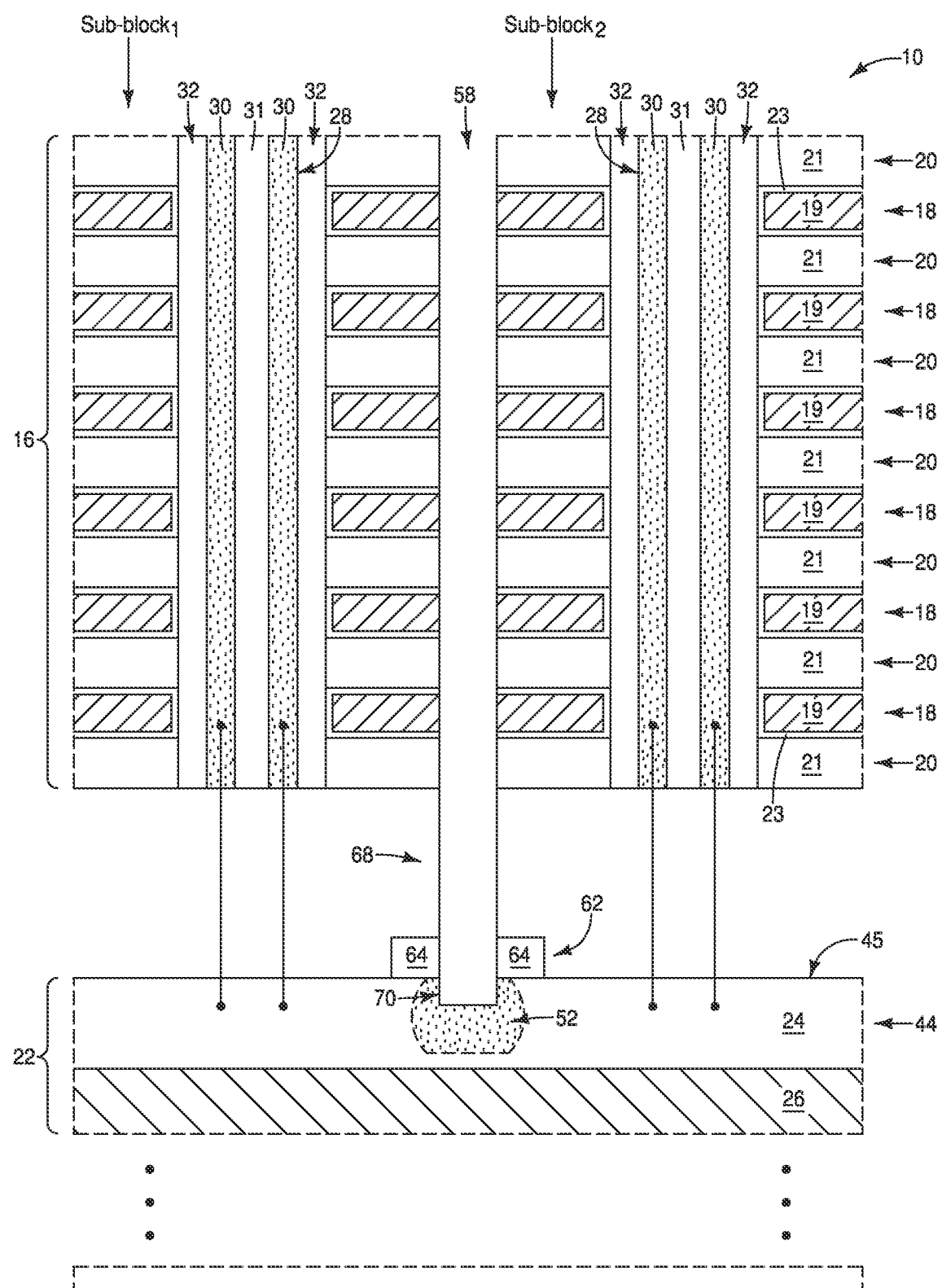

Referring to FIG. 23, the sacrificial material 56 is removed and replaced with the dielectric barrier material 23 and conductive material 19 to form a configuration analogous to that of FIG. 19. The trench 58 is shown to extended into the composition 48 within the region 52, as may occur if the hot-phosphoric-acid-etch utilized to remove the sacrificial material 56 also removes some of the composition 48 (in other embodiments, the composition 48 may be sufficiently resistive to the hot-phosphoric-acid-etch that the trench 58 does not extend into the composition 48). The trench 58 of FIG. 23 extends partially into the semiconductor material 24, but not entirely through such semiconductor material. In some embodiments, the trench 58 may be considered to be formed to comprise a first portion 68 at the process stage of FIG. 22, and a second portion 70 at the process stage of FIG. 23. The first portion 68 is formed prior to providing the additive (e.g., carbon) within the region 52, and the second portion 70 is formed after forming the additive within the region 52. In subsequent processing, the panel material 14 may be formed within the trench 58 to form a panel 12 analogous to that described above with reference to FIGS. 5 and 5A.

Figure 24:
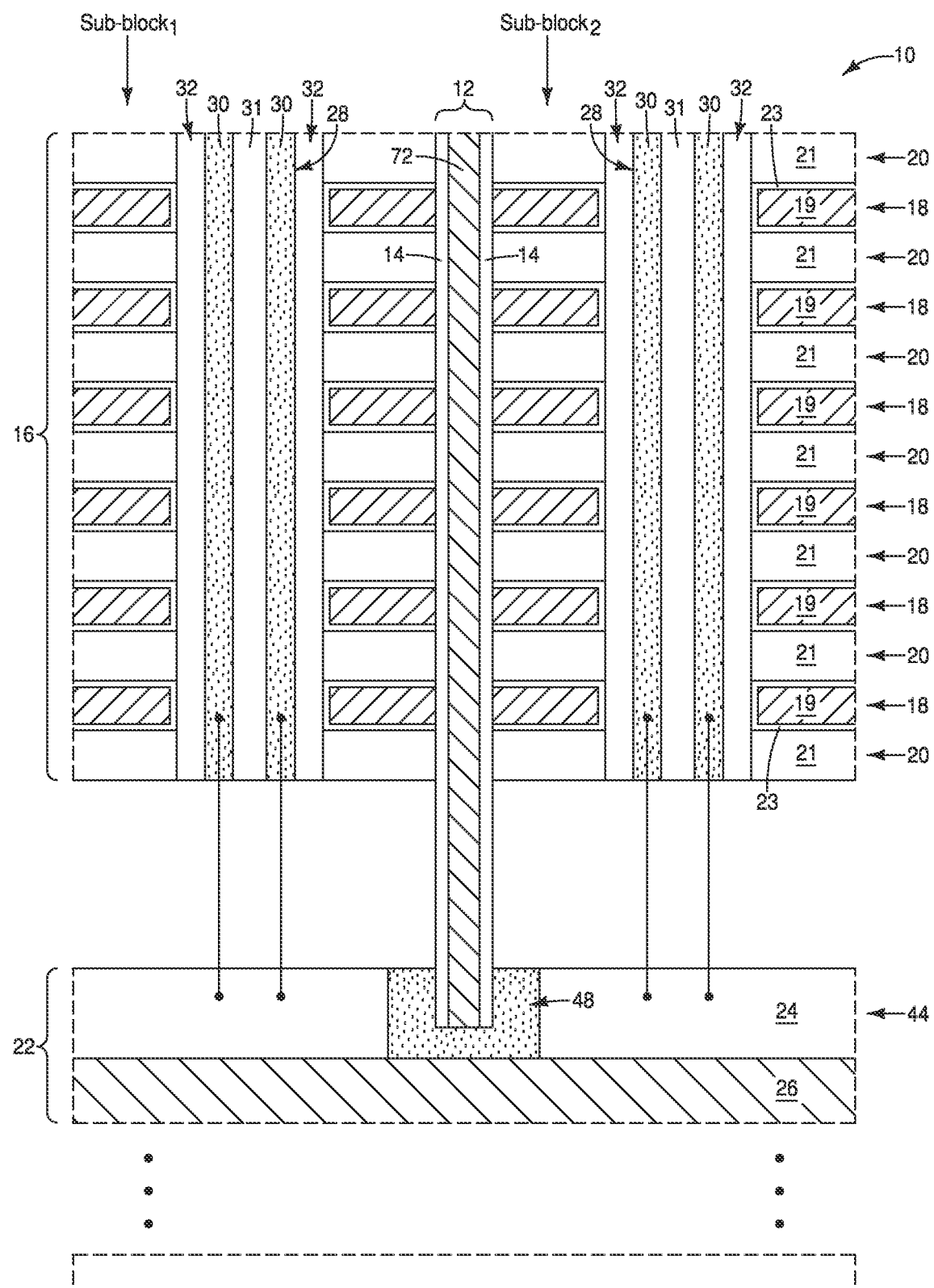
FIG. 24 is a diagrammatic cross-sectional side view of a region of an integrated assembly at an example process stage of another example embodiment.

In some embodiments, the insulative panel 12 (FIGS. 5 and 5A) may instead correspond to a panel comprising a conductive composition in addition to the insulative composition. For instance, FIG. 24 shows an assembly 10 analogous to that of FIG. 5A but in which the panel 12 includes conductive material 72 in addition to the insulative material 14. The illustrated panel has a laminate configuration, and specifically comprises the conductive material 72 as a conductive layer laterally between a pair of insulative layers comprising the insulative material 14. In the illustrated embodiment, the conductive material 72 directly contacts the semiconductor material 24 of the source structure 22. In some embodiments, the conductive material 72 may be utilized for coupling the source structure with logic circuitry (e.g., CMOS). The conductive material 72 may comprise any suitable electrically conductive composition (s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first structure containing semiconductor material, and having a second structure contacting the first structure. The first structure has a composition along an interface with the second structure. The composition includes additive to a concentration within a range of from about $10^{18}$ atoms/cm$^3$ to about $10^{21}$ atoms/cm$^3$. The additive includes one or more of carbon, oxygen, nitrogen and sulfur.

Some embodiments include a method of forming an integrated assembly. A source structure is formed to comprise semiconductor material over metal-containing material. Additive is within a region of the semiconductor material to a concentration within a range of from about $10^{18}$ atoms/cm$^3$ to about $10^{21}$ atoms/cm$^3$. The additive comprises one or more of carbon, oxygen, nitrogen and sulfur. The region of the semiconductor material is etched into utilizing an etchant comprising phosphoric acid. The etching forms an opening which extends into, but not entirely through, the semiconductor material of said region. A second structure is formed over the source structure and extends into said opening.

Some embodiments include a method of forming an integrated assembly. A stack of alternating first and second levels is formed over a source structure. The first levels comprise sacrificial material and the second levels comprise a first insulative material. The source structure comprises semiconductor material over metal-containing material. A trench is formed which extends through the stack and to a region of the semiconductor material. Carbon is provided within the region of the semiconductor material. The sacrificial material of the first levels is removed to leave voids. Conductive material is formed within the voids. After the conductive material is formed, a panel is formed within the trench. The panel comprises a second insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a source structure comprising semiconductor material over metal-containing material; additive being within a region of the semiconductor material to a concentration within a range of from $10^{18}$ atoms/cm$^3$ to $10^{21}$ atoms/cm$^3$; the additive comprising one or more of the group of carbon, oxygen, nitrogen and sulfur;
    etching into the region of the semiconductor material utilizing an etchant comprising phosphoric acid; the etching forming an opening which extends into, but not entirely through, the semiconductor material of said region; and
    forming a second structure over the source structure and extending into said opening.

2. The method of claim 1 wherein the additive includes the carbon.

3. The method of claim 1 wherein the additive includes the nitrogen.

4. The method of claim 1 wherein the additive includes the oxygen.

5. The method of claim 1 wherein the additive includes the sulfur.

6. The method of claim 1 wherein the second structure comprises insulative material.

7. The method of claim 1 wherein the semiconductor material comprises n-type silicon having n-type dopant therein to a concentration of at least $10^{20}$ atoms/cm$^3$.

8. The method of claim 1 wherein the semiconductor material comprises p-type silicon having p-type dopant therein to a concentration of at least $10^{20}$ atoms/cm$^3$.

9. A method of forming an integrated assembly, comprising:
    forming a stack of alternating first and second levels over a source structure; the first levels comprising sacrificial material and the second levels comprising a first insulative material; the source structure comprising semiconductor material over metal-containing material;
    forming a trench which extends through the stack and to a region of the semiconductor material;
    providing carbon within the region of the semiconductor material;
    removing the sacrificial material of the first levels to leave voids;
    forming conductive material within the voids; and
    after forming the conductive material, forming a panel within the trench; the panel comprising a second insulative material.

10. The method of claim 9 wherein the carbon is provided to a concentration within a range of from $10^{18}$ atoms/cm$^3$ to $10^{21}$ atoms/cm$^3$.

11. The method of claim 9 wherein the carbon is provided within the region prior to forming the trench.

12. The method of claim 9 wherein the panel consists essentially of the second insulative material.

13. The method of claim 9 wherein the panel separates a first block region of a memory arrangement from a second block region of the memory arrangement.

14. The method of claim 13 wherein the first and second block regions include memory cells, with the individual memory cells including charge-trapping material adjacent channel material; and wherein the channel material is electrically coupled with the source structure.

* * * * *